(12) United States Patent
Kirihara et al.

(10) Patent No.: US 8,823,021 B2
(45) Date of Patent: Sep. 2, 2014

(54) LED MODULE AND LIGHTING DEVICE USING THE SAME

(75) Inventors: Masao Kirihara, Kadoma (JP); Kanako Hoshino, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 341 days.

(21) Appl. No.: 12/736,576

(22) PCT Filed: Apr. 24, 2009

(86) PCT No.: PCT/JP2009/058165
§ 371 (c)(1),
(2), (4) Date: Oct. 20, 2010

(87) PCT Pub. No.: WO2009/131213
PCT Pub. Date: Oct. 29, 2009

(65) Prior Publication Data
US 2011/0031509 A1  Feb. 10, 2011

(30) Foreign Application Priority Data
Apr. 24, 2008 (JP) ................. 2008-114596

(51) Int. Cl.
| | |
|---|---|
| *H01L 33/08* | (2010.01) |
| *H01L 33/48* | (2010.01) |
| *H05K 1/11* | (2006.01) |
| *H01L 33/64* | (2010.01) |
| *F21S 4/00* | (2006.01) |
| *H05K 1/02* | (2006.01) |
| *H05K 1/18* | (2006.01) |
| *F21Y 101/02* | (2006.01) |
| *H01L 33/58* | (2010.01) |

(52) U.S. Cl.
CPC .............. *H01L 33/486* (2013.01); *H05K 1/112* (2013.01); *H01L 33/642* (2013.01); *F21S 4/003* (2013.01); *H05K 2201/10106* (2013.01); *H05K 1/0298* (2013.01); *H05K 1/189* (2013.01); *H05K 1/0287* (2013.01); *F21Y 2101/02* (2013.01); *H01L 33/58* (2013.01); *H05K 1/181* (2013.01); *H01L 2224/48091* (2013.01); *H01L 2924/10253* (2013.01)
USPC .................. 257/81; 257/88; 257/89; 257/700

(58) Field of Classification Search
USPC ........................ 257/81, 88, 89, 700
See application file for complete search history.

(56) References Cited

U.S. PATENT DOCUMENTS 5,506,755 A * 4/1996 Miyagi et al. ................. 361/720
6,834,977 B2 * 12/2004 Suehiro et al. ................ 362/187

(Continued)

FOREIGN PATENT DOCUMENTS

| JP | 2002-162626 A | 6/2002 |
|---|---|---|
| JP | 2002-286959 A | 10/2002 |

(Continued)

OTHER PUBLICATIONS

International Search Report dated Aug. 4, 2009, issued for PCT/JP2009/058165.

*Primary Examiner* — Eugene Lee
(74) *Attorney, Agent, or Firm* — Edwards Wildman Palmer LLP

(57) ABSTRACT

The LED module comprises a flexible wiring substrate and surface mounting type LED packages. The flexible wiring substrate is formed at its surface with power supply terminals which comprises a first electrode pad and a second electrode pad, and is formed with a patterned wiring being electrically connected to the patterned wiring. The surface mounting type LED package comprises an LED chip and a mounting substrate. The mounting substrate is formed at its front surface with a recess, and its rear surface with a first connection electrode and the second connection electrode which are electrically connected to the first electrode pad and the second electrode pad, respectively when the mounting substrate is mounted on the flexible wiring substrate. The LED chip is disposed within the recess so as to receive the electrical current through the outside connection electrode and the power supply terminal.

28 Claims, 20 Drawing Sheets

(56) References Cited

U.S. PATENT DOCUMENTS

| | | | |
|---|---|---|---|
| 6,979,890 B2 * | 12/2005 | Kambe et al. | 257/678 |
| 7,550,319 B2 * | 6/2009 | Wang et al. | 438/125 |
| 7,557,440 B2 * | 7/2009 | Yamamoto et al. | 257/700 |
| 7,621,654 B2 * | 11/2009 | Nishimoto et al. | 362/241 |
| 7,714,341 B2 * | 5/2010 | Chil Keun et al. | 257/98 |
| 7,838,897 B2 * | 11/2010 | Higashi et al. | 257/99 |
| 7,868,332 B2 * | 1/2011 | Rho et al. | 257/79 |
| 2002/0109074 A1 | 8/2002 | Uchida | |
| 2004/0065894 A1 | 4/2004 | Hashimoto et al. | |
| 2004/0227258 A1 * | 11/2004 | Nakatani | 257/787 |
| 2005/0151062 A1 | 7/2005 | Uchida | |
| 2006/0001117 A1 | 1/2006 | Uchida | |
| 2006/0131596 A1 | 6/2006 | Ouderkirk et al. | |
| 2006/0131601 A1 | 6/2006 | Ouderkirk et al. | |
| 2006/0131602 A1 | 6/2006 | Ouderkirk et al. | |
| 2006/0214178 A1 | 9/2006 | Choi et al. | |
| 2008/0038854 A1 | 2/2008 | Choi et al. | |
| 2008/0258156 A1 * | 10/2008 | Hata | 257/88 |
| 2009/0159902 A1 | 6/2009 | Yasuda et al. | |

FOREIGN PATENT DOCUMENTS

| | | |
|---|---|---|
| JP | 2003-152225 A | 5/2003 |
| JP | 2005-327820 A | 11/2005 |
| JP | 2006-270046 A | 10/2006 |
| JP | 2006-332351 A | 12/2006 |
| JP | 2007-027638 A | 2/2007 |
| JP | 2007-288097 A | 11/2007 |
| JP | 2007-294834 A | 11/2007 |
| JP | 2009-010044 A | 1/2009 |
| WO | WO-2006/068762 A2 | 6/2006 |
| WO | WO-2006/068765 A2 | 6/2006 |
| WO | WO-2006/068766 A2 | 6/2006 |

* cited by examiner

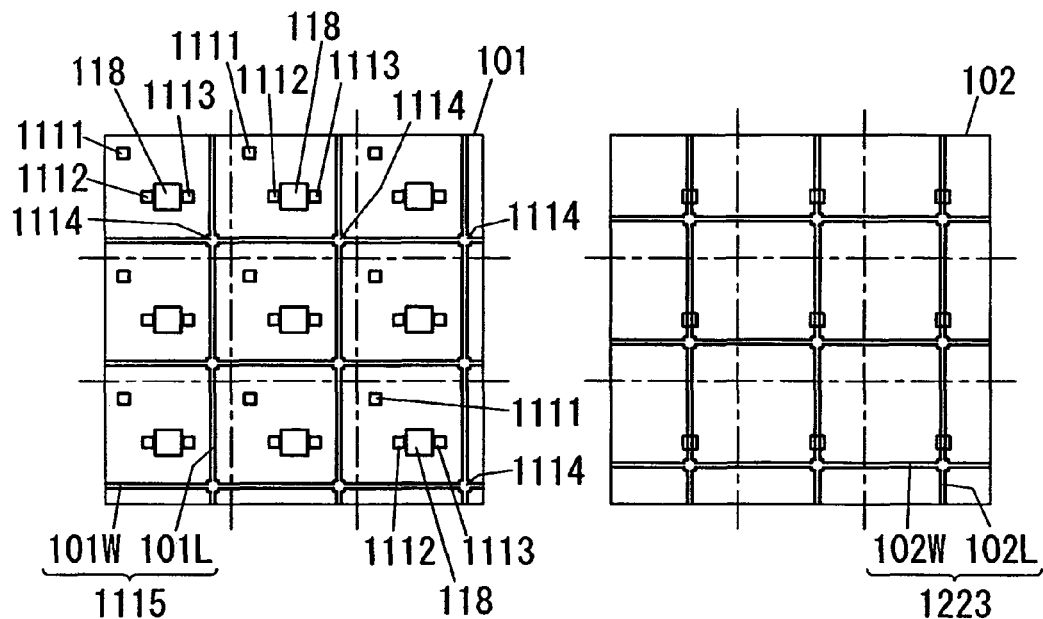
FIG. 6 A
FIG. 6 B
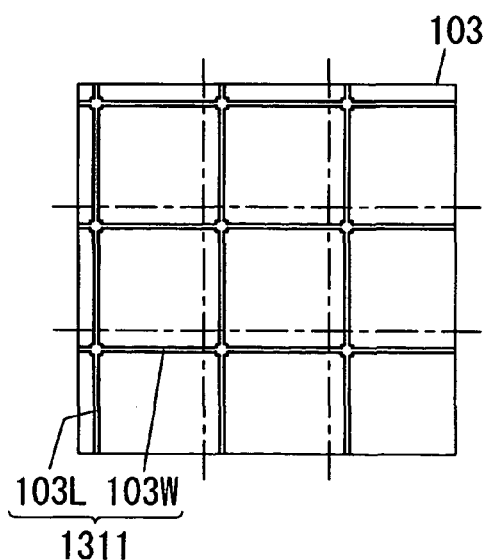
FIG. 6 C
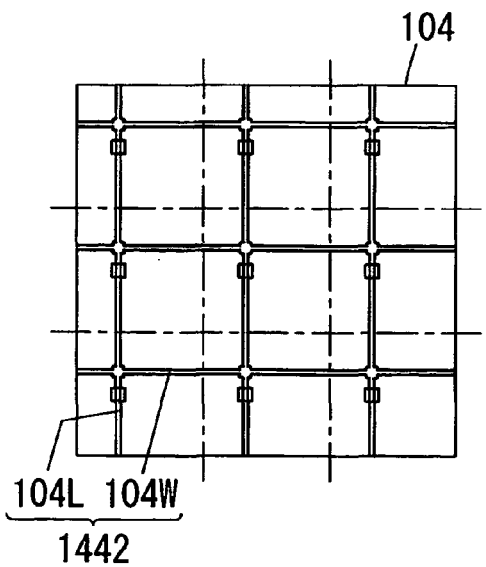
FIG. 6 D

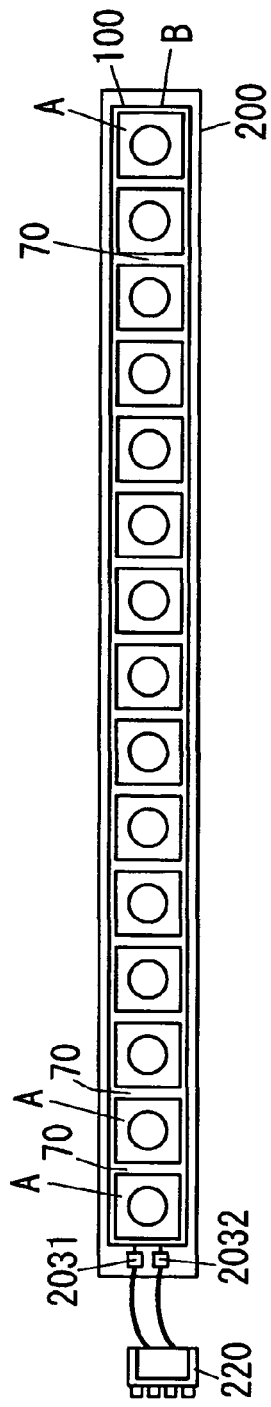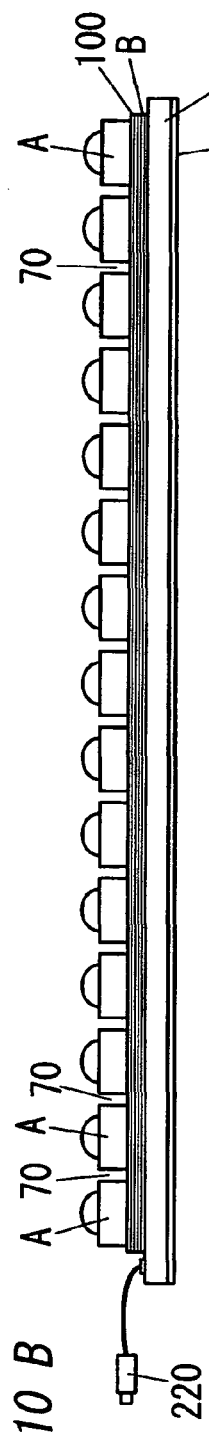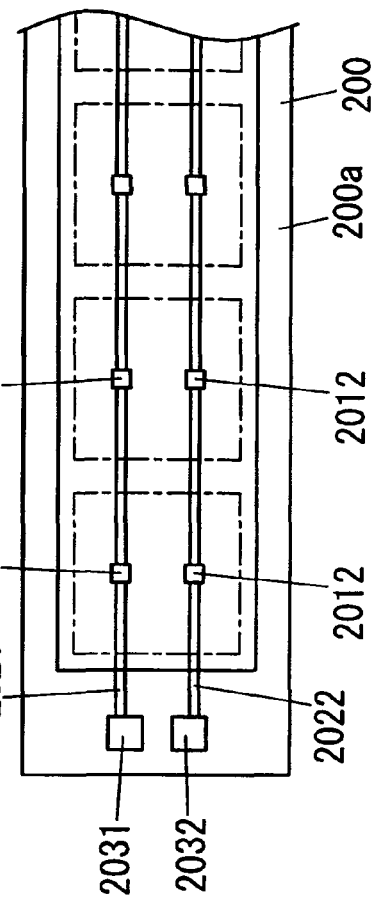
FIG. 10 A
FIG. 10 B
FIG. 10 C

LED MODULE AND LIGHTING DEVICE USING THE SAME

TECHNICAL FIELD

This invention relates to an LED module and a lighting device using the LED module.

BACKGROUND ART

Japanese patent application publication No. 2005-327820A discloses a prior art surface mounting type LED package. The surface mounting type LED package comprises an LED chip, a mounting substrate, and a cover. The mounting substrate is made from a semiconductor substrate. The semiconductor substrate is provided at its top surface with a recess. The LED chip is disposed in the recess. The cover is made of glass. The cover is attached to the mounting substrate such that the cover covers an opening of the recess.

In the prior art surface mounting type LED package, the mounting substrate is provided at its bottom surface with a pair of patterned electrical conductor. Each the patterned electrical conductor is electrically connected to each electrode of the LED chip. In addition, the mounting substrate is formed at its rear surface with a pair of external connection electrode. Each the external connection electrode is electrically connected each the patterned electrical conductor through a penetration wiring.

A plurality of the surface mounting type LED package acts as a light source of the lighting device, and attached to the lighting device having a various shape.

DISCLOSURE OF THE INVENTION

Problem to be Resolved by the Invention

However, the surface mounting type LED package is very small. Therefore, it is difficult to attach the surface mounting type LED package to the lighting device having a various shape in high density.

This invention is achieved to solve the above problem. An object in this invention is to produce an LED module having a plurality of the surface mounting type LED package, and is easily attached to something easily and in high density. In addition, an object in this invention is to produce a lighting device having the LED module.

Means of Solving the Problem

In order to solve the above problem, the LED module in this invention comprises a flexible wiring substrate and a plurality of surface mounting type LED packages. The flexible wiring substrate is provided at its surface with a plurality of power supply terminals. The flexible wiring substrate is provided with a patterned wiring. Each the power supply terminals comprises a first electrode pad and a second electrode pad. Each the power supply terminals is electrically connected to the patterned wiring. A plurality of the surface mounting type LED packages are mounted on the flexible wiring substrate. Each the surface mounting type LED chip comprises an LED chip and a mounting substrate. Each the mounting substrate is formed at its front surface with a recess. Each the mounting substrate is formed at its rear surface with an external connection electrode. The external connection electrode comprises a first connection electrode and a second connection electrode. Each the mounting substrate is mounted on the flexible wiring substrate such that the first connection electrode and the second connection electrode are electrically connected to the first electrode pad and the second electrode pad, respectively. The LED chip is disposed within the recess. The LED chip is configured to receive electrical current through the external connection electrode and the power supply terminal.

It is preferred that the LED module is formed by cutting an LED module wafer. The LED module wafer comprises an LED package wafer and a flexible wiring wafer. The LED package wafer comprises a plurality of the surface mounting type LED packages. The flexible wiring wafer is formed into the flexible wiring substrate when said flexible wiring wafer is cut. The flexible wiring wafer is directly coupled to the LED package wafer such that each the patterned wiring is connected to each said external connection electrode. The LED package wafer is formed with a groove which reaches a top surface of the flexible wiring substrate. The groove surrounds each the surface mounting type LED package so that the surface mounting type LED package is spaced from adjacent the surface mounting type LED package.

In this case, it is possible to obtain the LED module having a desired shape by cutting the LED package wafer along the groove. In addition, each the surface mounting type LED package is spaced from adjacent the surface mounting type LED package by a width of the groove. Therefore, it is possible to narrow the distance between each one of the surface mounting type LED packages and the other of the surface mounting type LED packages.

It is preferred that the flexible wiring substrate is provided with an electrical insulation substrate, a first penetration wiring, and a second penetration wiring. The electrical insulation substrate has flexibility. The patterned wiring is disposed in an internal portion of the electrical insulation substrate. The first penetration wiring is formed in the internal portion of the electrical insulation substrate so as to electrically connect the first connection electrode to the patterned wiring. The second penetration wiring is formed in the internal portion of the electrical insulation substrate so as to electrically connect the second connection electrode with the patterned wiring.

It is preferred that the patterned wiring comprises a first patterned circuit and a second patterned circuit. The first patterned circuit is spaced from the second patterned circuit. The first penetration wiring is spaced from the second patterned circuit. The first penetration wiring is formed in the electrical insulation substrate so as to electrically connect the first connection electrode to the first patterned circuit. The second penetration wiring is spaced from the first patterned circuit. The second penetration wiring is formed in the electrically insulation substrate so as to electrically connect the second connection electrode to the second patterned circuit. The first penetration wiring is spaced from the second penetration wiring.

In this case, it is possible to arrange all the LED chips in parallel with each other. Therefore, it is possible to apply the electrical current uniformly to all the LED chips. Consequently, it is possible to obtain the LED chip being configured to emit the light which has an amount of the light equal to each other.

It is preferred that the surface mounting type LED package further comprising a thermal via and a heat radiation layer. The heat radiation layer is disposed on the rear surface of the mounting substrate. The heat radiation layer has heat conductivity which is higher than heat conductivity of the mounting substrate. The thermal via is configured to thermally couple the LED chip to the heat radiation layer. The thermal via has heat conductivity which is higher than the heat conductivity of the mounting substrate. The flexible wiring substrate further comprises a first heat radiation pad and a second heat radiation pad. The first heat radiation pad is formed on the front surface of the flexible wiring substrate. The second heat radiation pad is formed on the rear surface of the flexible wiring substrate. The surface mounting type LED package is mounted on the flexible wiring substrate such that the first heat radiation pad is in contact with the heat radiation layer. The first heat radiation pad is aligned with the second heat radiation pad in a thickness direction of the flexible wiring substrate.

It is preferred that the thermal via is made of metal. It is more preferred that the metal is Cu. In addition, it is preferred that the thermal via is formed such that the thermal via extends from the rear surface of the mounting substrate to the bottom of the recess. The LED chip is disposed on the bottom of the recess.

It is preferred that the mounting substrate is made of semiconductor. It is more preferred that the mounting substrate is made of silicon.

In this case, the thermal via thermally couples the LED chip to the heat radiation layer. When the LED chip emits the light, the LED chip also generates the heat. The heat is transferred to the flexible wiring substrate through the heat radiation layer and the first heat radiation pad.

It is preferred that each the LED packages further comprises the light detection element. The light detection element is configured to detect an amount of the light which is emitted from the LED chip.

It is preferred that the light detection element is disposed in an inside of the recess such that the light detection element is configured to detect the light which is emitted from the LED chip.

It is preferred that the surface mounting type LED package further comprising an electrical current regulation circuit. The electrical current regulation circuit is configured to regulate an amount of the electrical current which is applied to the LED chip on the basis of an amount of the light by which the light detection element detects.

In this case, an amount of the light emitted from each the LED chip is regulated on the basis of output which is output from the light detection element. Therefore, it is possible to uniform an amount of the light which is emitted from each the LED chip.

It is preferred that the LED module is formed by cutting an LED module wafer. The LED module wafer comprises an LED package wafer and a flexible wiring wafer. The LED package wafer comprises a plurality of the surface mounting type LED package, a plurality of the light detection element, and a plurality of the electrical current regulation circuit. The flexible wiring wafer is formed into the flexible wiring substrate when the flexible wiring wafer is cut. The flexible wiring wafer is directly coupled to the LED package wafer such that each the patterned wiring is electrically connected to each the external connection electrode. The LED package wafer is formed with a groove which reaches a top surface of the flexible wiring substrate. The groove is configured to surround the surface mounting type LED package so that the surface mounting type LED package is spaced from adjacent the surface mounting type LED package.

It is preferred that the mounting substrate comprises a base, a spacer, and a frame. The spacer is formed with an opening. The opening penetrates through the spacer in a thickness direction of the spacer. The spacer is disposed on a front surface of the base. The frame is formed with an aperture. The frame is disposed on a front surface of the spacer such that the frame is spaced from the base. The base is cooperative with the spacer and the frame to form the recess. The frame is formed to have an inner circumference surface which is located inwardly of an upper end of an inner circumference surface of the spacer. The light detection element is disposed on a lower surface of the frame such that the light detection element is located between the inner circumference surface of the frame and the inner circumference surface of the spacer.

The above LED module is attached to the lighting device. When the LED module is attached to the lighting device, it is preferred that the lighting device further comprises a controller. The controller is configured to regulate an amount of the electrical current which is supplied to each the surface mounting type LED package on the basis of an amount of the light which is detected by the light detection element. Consequently, a plurality of the surface mounting type LED packages emit a predetermined amount of the light.

It is preferred that the first patterned circuit and the second patterned circuit are formed in said electrical insulation substrate such that the first patterned circuit is spaced from the second patterned circuit in a thickness direction of the flexible wiring substrate.

It is preferred that the flexible wiring substrate is provided at its rear surface with a plurality of external terminal. Each the external terminal comprises a first terminal electrode and a second terminal electrode. Each the first penetration wiring is configured to electrically connect the first terminal electrode to the first connection electrode. Each the second penetration wiring is configured to electrically connect the second terminal electrode to the second connection electrode.

In this case, it is possible to supply the electrical current to all the LED chips only by connecting one of the first terminal electrodes and one of the second terminal electrodes to the power source.

It is preferred that the first patterned circuit comprises a first lengthwise wiring and a plurality of first widthwise wirings. The first widthwise wirings are transverse to the first lengthwise wiring. The second patterned circuit comprises a second lengthwise wiring and a plurality of second widthwise wirings. The second widthwise wirings are transverse to the second lengthwise wiring.

The first patterned circuit is provided with a first intersection point at which the first lengthwise wiring intersects the first widthwise wiring. The second patterned circuit being provided with a second intersection point at which the second lengthwise wiring intersects the second widthwise wiring. It is preferred that the first intersection point is offset from said second intersection point.

In this case, it is possible to form the first penetration wiring and the second penetration wiring along the thickness direction of the flexible wiring substrate.

It is preferred that the surface mounting type LED package further comprises a temperature detection element. The temperature detection element is configured to detect temperature of said LED chip. The controller is configured to regulate an amount of the electrical current "on the basis of an amount of the light by which the light detection element detects" and "on the basis of the temperature of the LED chip".

In this case, it is possible to detect an amount of the light which is emitted from the LED chip, accurately.

In contrast, it is preferred that the surface mounting type LED package further comprises a temperature detection element. The temperature detection element is configured to detect a temperature of the LED chip. The controller is configured to regulate the electrical current supplied to a plurality of the surface mounting type LED package "on the basis of an amount of the light by which the light detection element detects" and "on the basis of the temperature by which the temperature detection element detects". Consequently a plurality of the surface mounting type LED package emits a predetermined amount of the light.

It is preferred that the temperature detection element is disposed in the mounting substrate such that the temperature detection element is located immediately below the LED chip.

It is preferred that the surface mounting type LED package further comprises a plurality of thermal vias and a heat radiation layer. The heat radiation layer is disposed on the rear surface of the mounting substrate. Each the thermal via is configured to thermally couple the LED chip to the heat radiation layer. Each the thermal via has heat conductivity which is higher than the heat conductivity of the mounting substrate. The thermal vias is electrically insulated from each other. The flexible wiring substrate further comprises a first heat radiation pad and a second heat radiation pad. The first heat radiation pad is disposed on a front surface of the flexible wiring substrate. The second heat radiation pad is disposed on a rear surface of the flexible wiring substrate. The surface mounting type LED package is mounted on the flexible wiring substrate such that the first heat radiation pad is in contact with the heat radiation layer. The first heat radiation pad is aligned with the second heat radiation pad in a thickness direction of the flexible wiring substrate. The temperature detection element comprises a diode which has a p-type region and an n-type region. Both the p-type region and the n-type region are thermally coupled to the thermal via.

It is preferred that the mounting substrate comprises a first base and a second base. The first base is made from the semiconductor substrate. The first base is formed with an opening which penetrates through the first base along a thickness direction of the first base so that the first base is shaped to have a frame shape. The second base is shaped to have a mount portion which is protruded forwardly. The mounting portion has a shape which corresponds to a shape of the opening of the first base. The first base is disposed on the second base such that the mount portion is inserted into the opening. The LED chip is mounted on the mount section. The second base is made of metal.

It is preferred that a lower surface of the second base defines the rear surface of the mounting substrate. Corresponding to this definition, the upper surface of the first base and the upper surface of the mount section define the front surface of the mounting substrate.

It is preferred that the mounting substrate comprises a base, a spacer, and a frame. Both the spacer and the frame is made from a semiconductor substrate. The spacer is shaped to have an opening which penetrates through the spacer in a thickness direction of the spacer. The spacer is disposed on a front surface of the base. The frame is formed with an aperture. The frame is disposed on a front surface of the spacer such that the frame is spaced from the base. The base is cooperative with the spacer and the frame to form the recess. The base has heat conductivity which is higher than heat conductivity of the semiconductor substrate.

It is preferred that the base being made of metal. The base is provided at its surface with an electrical insulation film. The external connection electrode and the power supply terminal are electrically insulated from the base by the electrical insulation film.

It is preferred that the mounting substrate comprises a base and a heat radiation plate. The heat radiation plate is disposed in the base such that the heat radiation plate penetrates through the base in a thickness direction of the base. The LED chip is located in an upper side of the heat radiation plate. The heat radiation plate is made of metal. The base is made of a light-sensitive resin composition.

In this case, it is possible to prevent the strain of the base.

It is preferred that the mounting substrate further comprises a spacer and a frame. The spacer is formed with an opening which penetrates through the spacer in a thickness direction of the spacer. The spacer is disposed on a front surface of the base. The frame is made of semiconductor. The frame is formed with an aperture. The frame is disposed on a front surface of the spacer such that the frame is spaced from the base. The base is cooperative with the spacer and the frame to form the recess. The spacer is made of a light-sensitive resin composition.

It is preferred that the base is cooperative with the spacer and the frame to construct a heat transfer path. The heat transfer path transfers heat which is generated by said LED chip to the light detection element. The surface mounting type LED package further comprises a heat insulation layer. The heat insulation layer is disposed in the base or the frame such that the heat insulation layer is located in the heat transfer path. The heat insulation layer has heat conductivity which is lower than heat conductivity of the semiconductor.

It is preferred that the heat insulation layer is disposed in the base such that the heat insulation layer is located between the LED chip and a lower end of an inside circumference surface of the spacer. The heat insulation layer is disposed in the base such that the heat insulation layer surrounds an entire circumference of the LED chip.

It is preferred that the heat insulation layer is disposed in the frame such that the heat insulation layer is located between the light detection element and an upper end of an inside circumference surface of the spacer. The heat insulation layer is disposed in said frame such that the heat insulation layer surrounds an entire circumference of the light detection element.

In this case, it is possible for the light detection element to detect an amount of the light which is emitted from the LED chip, accurately.

BRIEF EXPLANATION OF THE DRAWINGS

FIG. 1 B shows a side cross sectional view of the flexible wiring substrate and the surface mounting type LED package disposed on the flexible wiring substrate.

FIG. 6 A shows a top view of the resin sheet 101 and patterned circuit 1115 in the first embodiment.

FIG. 6 B shows a top view of the resin sheet 102 and the patterned circuit 1223 in the first embodiment.

FIG. 6 C shows a top view of the resin sheet 103 and the patterned circuit 1311 in the first embodiment.

FIG. 6 D shows a top view of the resin sheet 104 and the patterned circuit 1442 in the first embodiment.

FIG. 7 B shows a side view of the LED module and the wiring substrate in the first embodiment.

FIG. 7 C shows a top view of the wiring substrate in the first embodiment.

FIG. 8 B shows a top cross sectional view of a pole of the lighting device in the first embodiment.

FIG. 10 A shows a top view of the LED module and the wiring substrate in the second embodiment.

FIG. 10 B shows a side view of the LED module and the wiring substrate in the second embodiment.

FIG. 10 C shows a top view of the wiring substrate in the second embodiment.

BEST MODE FOR CARRYING OUT THE INVENTION

First Embodiment

Figure 1:
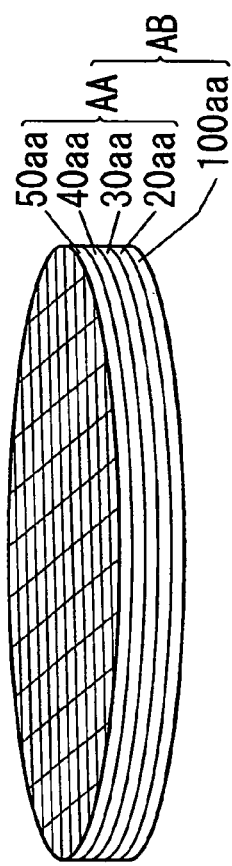
FIG. 1 A shows a perspective view of the LED module wafer.
Figure 1:
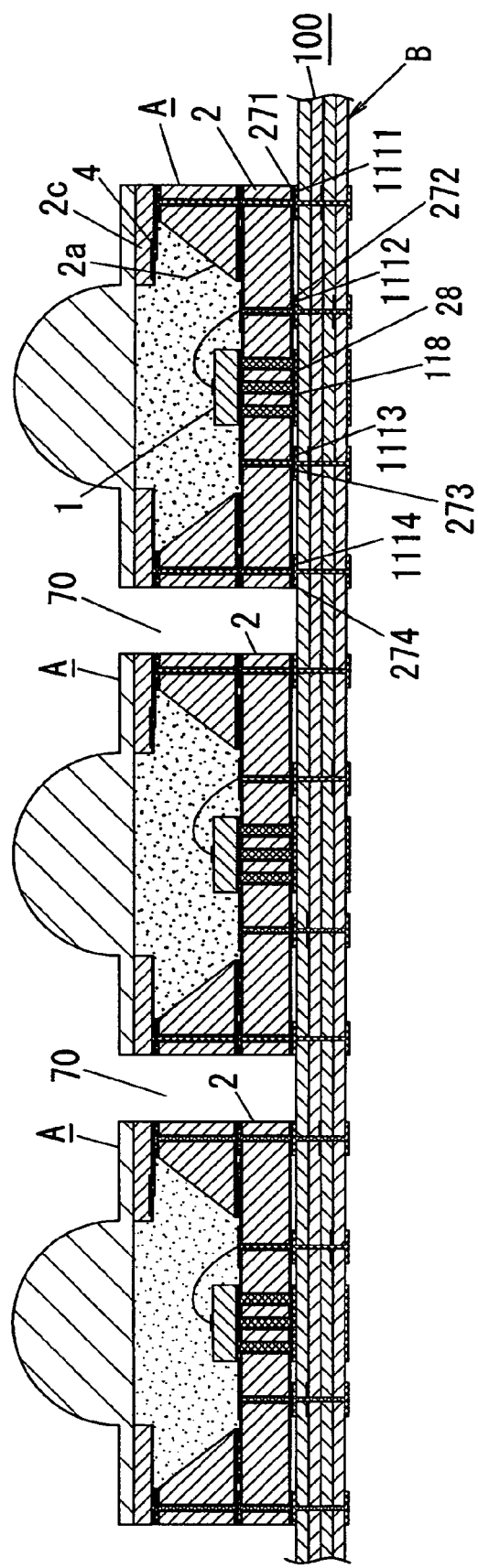
Figure 2:
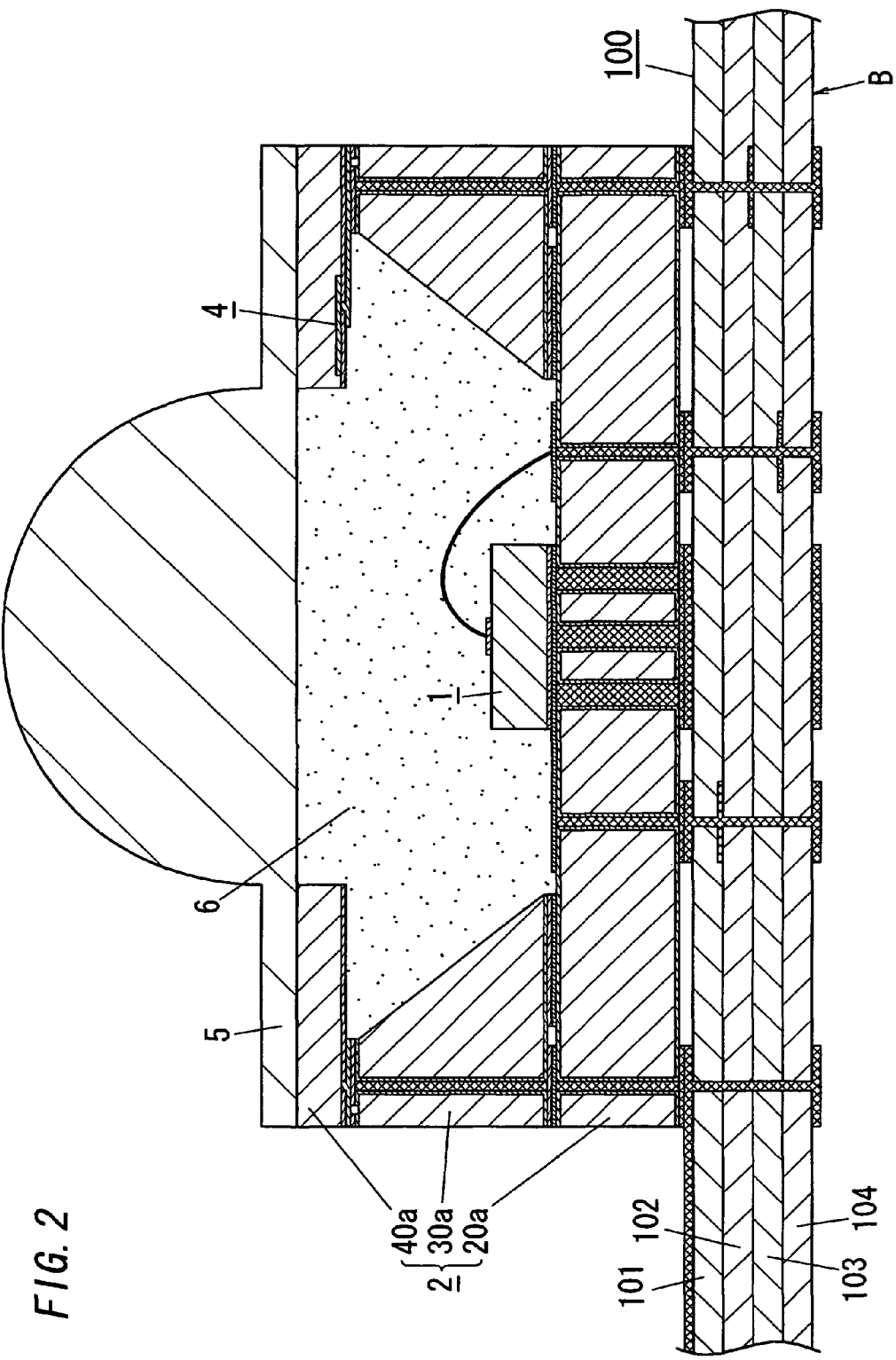
FIG. 2 shows a side cross sectional view of the flexible wiring substrate and the surface mounting type LED packages in the first embodiment.

An explanation of an LED module in the first embodiment of this invention is made with attached Figs. FIG. 1 B shows a side cross sectional view of the LED module B in this embodiment. FIG. 2 shows a part of side cross sectional view of the LED module in this embodiment. Each FIG. 1 B and FIG. 2 shows the LED module B of this embodiment comprising a flexible wiring substrate 100 and a plurality of surface mounting type LED packages A. A plurality of surface mounting type LED packages A are disposed on an upper surface of the flexible wiring substrate 100.

Figure 3:
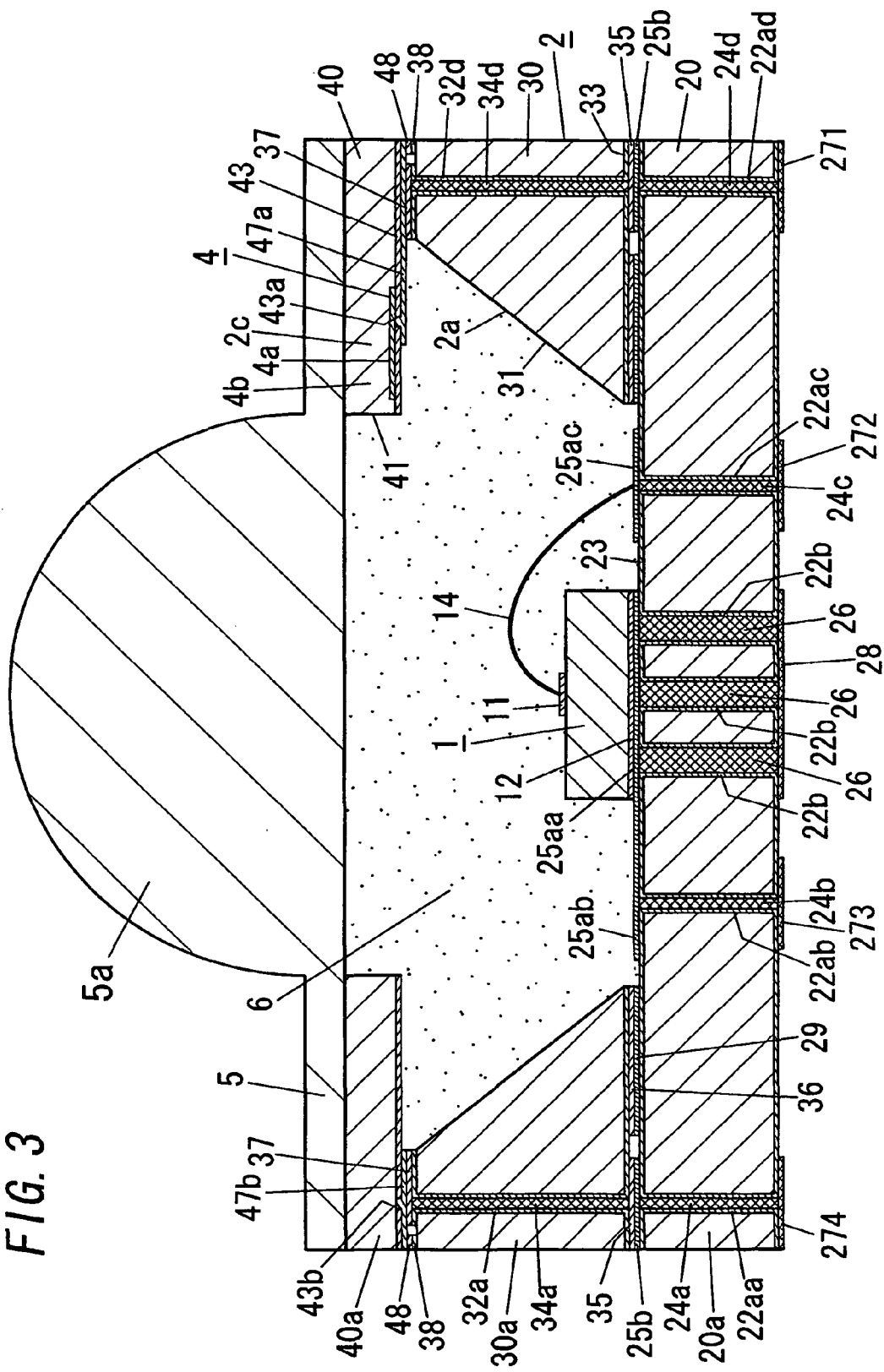
FIG. 3 shows a side cross sectional view of the surface mounting type LED package in the first embodiment.

FIG. 3 shows a side cross sectional view taken along the line of X-Y. As shown in FIG. 3, the surface mounting type LED package A comprises a mounting substrate 2, an LED chip 1, a sealing material 6, a cover 5, and wirings. Each the wiring is made of metal.

The mounting substrate 2 comprises a base 20, a spacer 30, and a frame 40. A base 20 is made from a silicone substrate 20a. The silicone substrate 20a is provided at its front surface and its rear surface with an electrical insulation film 23. The electrical insulation film is made of silicone dioxide film. The base 20 is provided for mounting the LED chip 1 on the upper side of the base 20. The silicon substrate 20a is formed with a plurality of through holes 22aa, 22ab, 22ac, 22ad. Each one of the through holes 22aa, 22ab, 22ac, 22ad penetrates through the silicon substrate 20a in a thickness direction of the silicon substrate. Each one of the through holes 22aa, 22ab, 22ac, 22ad is provided at its inside circumference surface with an electrical insulation film 23. The through holes 22aa, 22ab, 22ac, 22ad are provided for placing the penetration wirings 24a, 24b, 24c, 24d therein, respectively. The silicon substrate 20a is formed at its lower surface with an external connection electrode 271, 272, 273, 274. The external connection electrodes 271, 272, 273, 274 are electrically connected to the penetration wirings which extends through the through holes of the base 20, respectively. The external connection electrode 272 is defined as a first connection electrode. The external connection electrode 273 is defined as the second connection electrode. The connection electrode 272 is electrically connected to the penetration wiring 24c. The penetration wiring 24c is electrically connected to the electrode pad 25ac which is formed on the upper surface of the silicon substrate 20a. The connection electrode 273 is electrically connected to the penetration wiring 24b. The penetration wiring 24b is electrically connected to a wiring 25ab and the electrode pad 25aa which is disposed on the upper surface of the silicon substrate 20a. The connection electrode 274 is electrically connected to the penetration wiring 24a. The connection electrode 271 is electrically connected to the penetration wiring 24d. The silicon substrate 20a is provided at its center with nine through holes 22b. Each the through hole 22b penetrates through the silicon substrate 20a in the thickness direction of the silicon substrate 20a. The nine through holes 22b is arrayed in three rows and three columns in a plane perpendicular to the thickness direction of the flexible wiring substrate 100. Each the through holes 22b is provided at its inside circumference surface with an electrical insulation film 23. The electrical insulation film 23 is made of silicon dioxide film. Each the through hole 22b is provided with an inside for placing the thermal via 26. Consequently, the nine thermal vias penetrate through the silicon substrate 20a in the thickness direction of the silicon substrate 20a. Consequently, each the thermal via 26 penetrates from the rear surface of the base 20 to the front surface of the base 20. Therefore, each the thermal via 26 is extends from the rear surface of the base 20 to the bottom surface of the recess 2a through the base 20. Each the thermal via 26 is made of Cu. Each the thermal via 26 has a heat conductivity which is higher than heat conductivity of the silicon substrate 20a. On the other hand, each one of the thermal vias 26 is electrically insulated from the other of the thermal vias 26 by the electrical insulation film 23. In addition, the silicon substrate 20a is provided at its center of the lower surface with a heat radiation layer 28. The heat radiation layer 28 is located in a lower end of the thermal via 26. In contrast, the thermal via 26 is provided with an upper end which is thermally coupled to the LED chip 1 through the electrode pad 25aa. It is noted that FIG. 1 shows the three thermal vias 26 which is arrayed in the center column of the nine thermal vias 26. It goes without saying that the number of the thermal via 26 is not limited to nine. That is, it is possible to employ the mounting substrate 2 having a plurality of the thermal vias which are arrayed in ten rows and ten columns.

Figure 5:
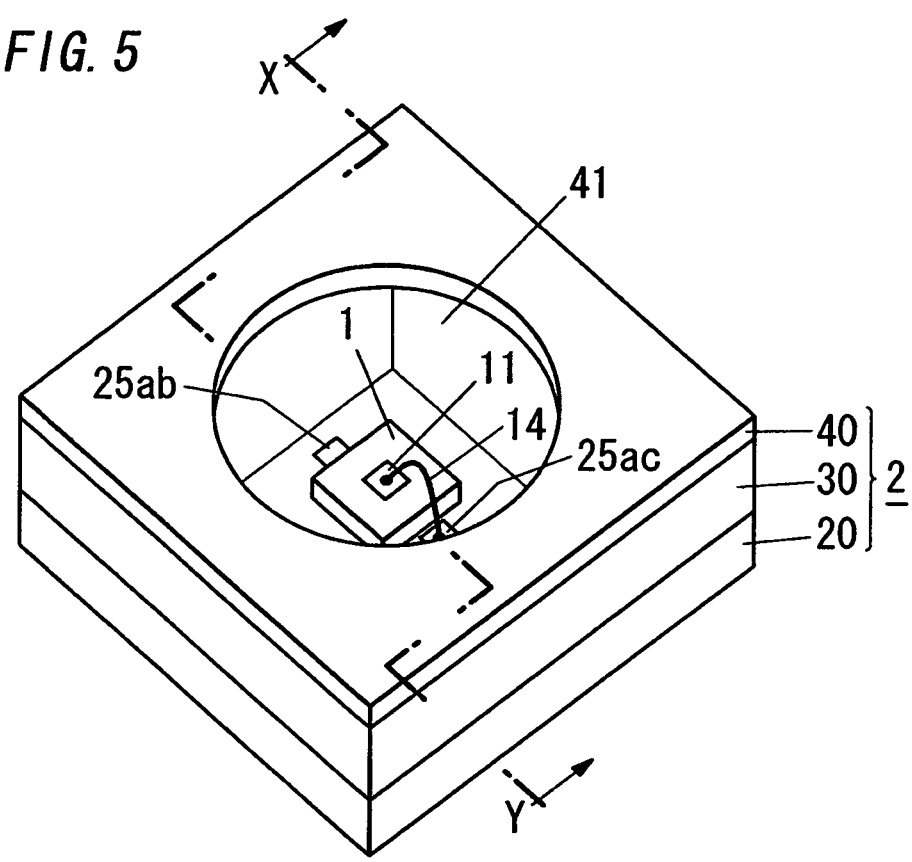
FIG. 5 shows a perspective view of the surface mounting type LED package in the first embodiment.

As shown in FIG. 3 and FIG. 5, the spacer 30 is disposed on an upper surface of the base 20. The spacer 30 is made from the silicon substrate 30a. The silicon substrate 30a is provided at its front surface and its rear surface with an electrical insulation film 33. The electrical insulation film 33 is made of silicon dioxide film. The silicon substrate 30a is formed at its center with an opening 31 which penetrates through the silicon substrate 30a in the thickness direction of the silicon substrate 30a. The opening 31 is formed by an appropriate step such as etching. The opening 31 is formed to have a dimension which gradually becomes larger from the rear surface toward the front surface. That is, the base 20 is cooperative with the spacer and the frame 40 to form a recess 22a. (The frame 40 is explained later.) The spacer 30 is provided at its inside circumference surface with a metal film. Consequently, the inside circumference surface is configured to reflect the light. A lower end of the inside circumference surface of the spacer is cooperative with the front surface of the base 20 to define the bottom surface of the recess 2a. In addition, the silicon substrate 30a is formed with a through hole 32a and a through hole 32d. Each one of the through hole 32a and the through hole 32d penetrates through the silicon substrate 30a in the thickness direction of the silicon substrate. Each one of the through hole 32a and the through hole 32d is provided at its inside circumference surface with an electrical insulation film 33. The through holes 32a, 32d place the penetration wiring 34a, 34d therein, respectively. The through hole 32a is formed in such a manner that the through hole 32a is communicated with the through hole 22aa. Consequently, the penetration wiring 24a is electrically connected to the penetration wiring 34a through the electrode pad 25b and the electrode pad 35. Similarly, the through hole 32d is formed such that the through hole 32d is communicated with the through hole 22ad through the electrode pad 25b and the electrode pad 35. Consequently, the penetration wiring 24d is electrically connected to the penetration wiring 34d.

The frame 40 is disposed on an upper surface of the spacer 30. The frame 40 is made of silicon substrate 40a. The silicon substrate is provided at its front surface and its rear surface with an electrical insulation film 43. The silicon substrate 40a is provided at its center with an aperture 41. The aperture 41 penetrates through the silicon substrate 40a in the thickness direction of the silicon substrate 40a. The aperture 41 is formed by an appropriate step such as etching. The silicon substrate 40a is provided at its lower surface with a light detection element 4 and a wiring 37. In addition, the frame 40 is disposed on an upper surface of the spacer such that the opening 31 communicates the aperture 41 with the upper surface of the base 20. That is, the frame 40 is disposed on the upper surface of the spacer 30 such that the opening 31 communicates the aperture 41 with the bottom surface of the recess 2a. The aperture 41 has an opening dimension which is smaller than an opening dimension of an upper end of the opening 31. Consequently, the inside circumference surface of the frame 40 is located inwardly of an upper end of the inside circumference surface of the spacer 30. Therefore, the frame 40 has a projection portion 2c which is projected inwardly of an upper end of the inside circumference surface of the spacer 30. The projection portion 2c is provided at its lower surface with a light detection element 4. In addition, the silicon substrate 40a is provided at its lower surface with a wiring 47a. The wiring 47a is configured to establish the electrical connection between the light detection element 4 and the penetration wiring 34d.

The light detection element 4 comprises a photo diode having a p-type 4a region and an n-type region 4b. The p-type region 4a is electrically connected to the wiring 47a. The n-type region 4b is disposed in an adjacent relation to the p-type region 4a. The n-type region 4b is electrically connected to the wiring 47a which is disposed in the contact hole 43a of the electrical insulation film 43. The n-type region 4b is electrically connected to the wiring 47b through the contact hole 43b which is formed in the electrical insulation film 43.

The LED chip 1 is provided at its lower surface with an electrode 11, and is provided at its upper surface with an electrode 12. The LED chip 1 is disposed on the front surface of the base 20 such that the electrode 12 is electrically connected to the electrode pad 25aa through the wiring 25ab. That is, the LED chip 1 is disposed on the bottom surface of the recess 2a so that the LED chip 1 is incorporated into the recess 2a. The electrode 11 is electrically connected to the electrode pad 25ac through the bonding wire 14. The LED chip 1 is configured to receive the electrical current through the electrodes 11, 12, whereby the LED chip 1 is configured to generate the light. As shown in FIG. 2, the LED chip 1 is located in an upper side of the thermal via 26. Consequently, the LED chip 1 is thermally coupled to the heat radiation layer 28 through the thermal via 26.

The recess 2a is filled with a sealing material 6. The sealing material 6 is made of material such as a silicone resin, an epoxy resin, an acrylic resin, a polycarbonate resin, and a glass. Therefore, the sealing material 6 has a translucency.

The cover 5 is disposed on the upper surface of the frame 40. The cover 5 is made of material such as a silicone resin, an acrylic resin, an epoxy resin, a polycarbonate resin, and glass. Therefore, the cover 5 has a translucency. The cover is formed at its center of the front surface with a lens 5a. The lens 5a projects forwardly.

The surface mounting type LED package A is obtained by the step of cutting the LED package wafer AA comprising a plurality of the surface mounting type LED package A by the dicing blade.

Figure 4:
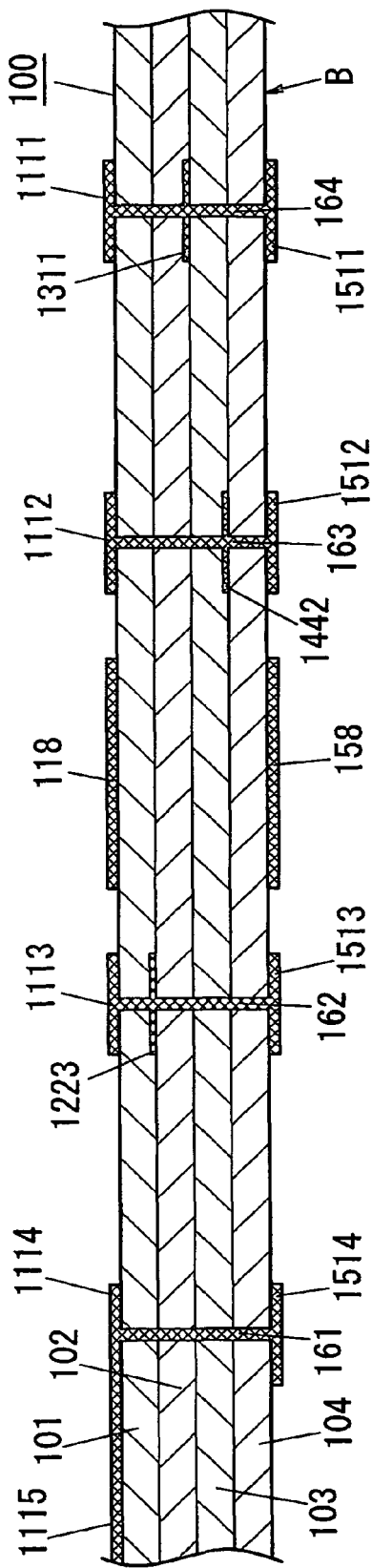
FIG. 4 shows a side cross sectional view of the flexible wiring substrate in the first embodiment.

Next, the flexible wiring substrate 100 is explained. As shown in FIG. 1 and FIG. 4, the flexible wiring substrate 100 comprising a plurality of the resin sheet, a plurality of patterned wirings, a plurality of penetration wirings, a plurality of power supply terminals, a plurality of the external terminals, the first heat radiation pad 118, and the second heat radiation pad 158.

A plurality of the resin sheet comprises a resin sheet 101, a resin sheet 102, a resin sheet 103, and a resin sheet 104. The resin sheet 103 is disposed on an upper surface of the resin sheet 104. The resin sheet 102 is disposed on an upper surface of the resin sheet 103. The resin sheet 101 is disposed on an upper surface of the resin sheet 102. Each the resin sheet is made of resin. Therefore, each the resin sheet has a flexibility. Each the resin sheet has an electrical insulation property. Therefore, a plurality of the resin sheets acts as the electrical insulation substrate of the flexible wiring substrate 100.

A plurality of the patterned wirings comprises a patterned circuit 1442, a patterned circuit 1331, a patterned circuit 1223, and a patterned circuit 1115. The patterned circuit 1442 is disposed between the resin sheet 103 and the resin sheet 104. The patterned circuit 1331 is disposed between the resin sheet 102 and the resin sheet 103. The patterned circuit 1223 is disposed between the resin sheet 101 and the resin sheet 102. The patterned circuit 1115 is disposed on the upper surface of the resin sheet 101. Consequently, each one of the patterned circuits is spaced from the other of the patterned circuits in a thicknes direction of the flexible wiring substrate 100.

FIG. 6A shows the resin sheet 101, the patterned circuit 1115, the electrode pad 1111, the electrode pad 1112, the electrode pad 1113, the electrode pad 1114, and the first heat radiation pad 118. The electrode pad 1111, the electrode pad 1112, the electrode pad 1113, the electrode pad 1114, and the first heat radiation pad 118 are disposed on the upper surface of the resin sheet 101. It is noted that the electrode pad 1112 is defined as the first electrode pad. The electrode pad 1113 is defined as the second electrode pad. As shown in FIG. 6A, the patterned circuit 1115 includes a plurality of lengthwise wirings 101L and a plurality of widthwise wirings 101W. The patterned circuit 1115 is electrically connected to the electrode pad 1114. In contrast, the patterned circuit 1115 is spaced from the electrode pad 1111, 1112, and 1113.

FIG. 6 B shows the resin sheet 102 and a patterned circuit 1223 which is disposed on an upper surface of the resin sheet 102. It should be noted that, in order to explain simply, the penetration wirings 161, 162, 163, and 164 are omitted. As shown in FIG. 6B, the patterned circuit 1223 includes a plurality of lengthwise wiring 102L and a plurality of widthwise wiring 102W. The patterned circuit 1223 is defined as the second patterned circuit.

FIG. 6 C shows the resin sheet 103 and the patterned circuit 1311 which is disposed on an upper surface of the resin sheet 103. It should be noted that, in order to explain simply, the penetration wirings 161, 162, 163, and 164 are omitted. As shown in FIG. 6 C, the patterned circuit 1311 includes a plurality of lengthwise wirings 103L and a plurality of widthwise wirings 103W.

FIG. 6 D shows the resin sheet 104 and the patterned circuit 1442 which is disposed on the upper surface of the resin sheet 104. It should be noted that the penetration wiring 161, 162, 163, and 164 are omitted in order to explain simply. As shown in FIG. 6 D, patterned circuit 1442 includes a plurality of lengthwise wiring 104L and a plurality of widthwise wirings 104W. The patterned circuit 1442 is defined as the first patterned circuit. In addition, as will be understood from FIG. 6 B and FIG. 6 D, each one of the intersection point at which the lengthwise wiring 102L intersects the widthwise wiring 102W is offset from the each one of the intersection point at which the lengthwise wiring 104L intersects the lengthwise wiring 104W.

A plurality of the penetration wirings comprises a penetration wiring 161, a penetration wiring 162, a penetration wiring 163, and a penetration wiring 164. The penetration wiring 163 extends in the thickness direction of the flexible wiring substrate 100, and penetrates through a plurality of the resin sheets such that the penetration wiring 163 is electrically connected to the patterned circuit 1442. The penetration wiring 164 extends in the thickness direction of the flexible wiring substrate, and penetrates through a plurality of the resin sheets such that the penetration wiring 164 is electrically connected to the patterned circuit 1311. The penetration wiring 162 extends in the thickness direction of the flexible wiring substrate 100, and penetrates through a plurality of the resin sheets such that the penetration wiring 162 is electrically connected to the patterned circuit 1223. The penetration wiring 161 is electrically connected to the patterned circuit 1115. The penetration wiring 161 extends in the thickness direction of the flexible wiring substrate 100, and penetrates through a plurality of the resin sheets. The penetration wirings 161, 162, 163, and 164 penetrates through a plurality of the resin sheets such that each one of the penetration wirings 161, 162, 163, and 164 is spaced from the other of the penetration wirings 161, 162, 163, and 164.

A plurality of the power supply terminal comprises an electrode pad 1114, an electrode pad 1113, an electrode pad 1112, and an electrode pad 1111. In addition, a plurality of the external terminals comprises a terminal electrode 1514, a terminal electrode 1513, a terminal electrode 1512, and a terminal electrode 1511. The penetration wiring 161 is connected to the electrode pad 1114 through an upper end of the penetration wiring 161. The penetration wiring 161 is connected to the terminal electrode 1514 through a lower end of the terminal electrode 1514. The penetration wiring 162 is connected to the electrode pad 1113 through an upper end of the penetration wiring 162. The penetration wiring 162 is connected to the terminal electrode 1513 through a lower end of the penetration wiring 162. Therefore, the penetration wiring 162 is defined as a second penetration wiring. In addition, the terminal electrode 1513 is defined as the second terminal electrode. The penetration wiring 163 is connected to the electrode pad 1112 through an upper end of the penetration wiring 163. The penetration wiring 163 is connected to the terminal electrode 1512 through a lower end of the penetration wiring 163. Therefore, the penetration wiring 163 is defined as the first penetration wiring. In addition, the terminal electrode 1512 is defined as the first terminal electrode. The penetration wiring 164 is connected to the electrode pad 1111 through an upper end of the penetration wiring 164. The penetration wiring 164 is connected to the terminal electrode 1511 through a lower end of the penetration wiring 164.

The first heat radiation pad 118 is disposed on the upper surface of the resin sheet 101. In contrast, the second heat radiation pad 158 is disposed on a lower surface of the resin sheet 104. As will be understood from FIG. 4, the first heat radiation pad 118 is aligned with the second heat radiation pad 158 in the thickness direction of a plurality of the resin sheets.

A plurality of the surface mounting type LED package is disposed on an upper surface of the flexible wiring substrate 100. When the surface mounting type LED package is disposed on the upper surface of the flexible wiring substrate 100, the connection electrode 271, 272, 273, 274 are connected to the electrode pad 1111, 1112, 1113, 1114, respectively. That is to say, the first electrode pad 1112 is connected to the connection electrode 272 which is defined as the first connection electrode. The second electrode pad 1113 is connected to the connection electrode 273 which is defined as the second connection electrode. In addition, the heat radiation layer 28 is connected to the first heat radiation pad 118.

The LED module B in this embodiment is manufactured as follows. In the manufacture of the LED module B, first, the light transmissive wafer 50*aa*, a light detection element forming wafer 40*aa*, an intermediate wafer 30*aa*, a base wafer 20*aa*, and a flexible wiring wafer 100*aa* is prepared. The light transmissive wafer 50*aa* is one wafer which is formed with a plurality of covers 5. The light detection element forming wafer 40*aa* is one wafer formed with a plurality of frames 40 and a plurality of the light detection elements 4. The intermediate wafer 30*aa* is one wafer which is formed with a plurality of spacers 30. The base wafer 20*aa* is one substrate which is provided with a plurality of the base 20 and a plurality of the LED chip 1 each of which is disposed on the upper surface of each the LED chip 1. The flexible wiring wafer 100*aa* is one flexible substrate. The flexible substrate is formed into the flexible wiring substrate 100, individually when the flexible substrate is cut. That is to say, the flexible wiring wafer 100*a* comprises a plurality of the first lengthwise wirings, a plurality of the first widthwise wirings, a plurality of the second lengthwise wirings, and a plurality of the second widthwise wirings.

The step of joining the intermediate wafer 30*aa* on the upper surface of the base wafer 20*aa* by the metal 29, 36 is performed. Subsequently, the step of joining the light detection element forming wafer 40*aa* on the upper surface of the intermediate wafer 30*aa* by metal 38, 48 is performed. Consequently, the LED package wafer AA having a plurality of the surface mounting type LED packages is prepared. Subsequently, the step of forming a plurality of the recesses 2*a* in the front surface of the LED package wafer AA is performed.

Subsequently, the sealing material 6 is filled in each the recesses 2*a*. Subsequently, the step of joining the LED package wafer AA on the front surface of the flexible wiring wafer 100*aa* is performed. Subsequently, the light transmissive wafer 50*aa* is joined on the front surface of the LED package wafer AA. When the light transmissive wafer 50*aa* is joined on the front surface of the LED package wafer AA, each one of the connection electrodes 271, 272, 273, and 274 is connected to each the electrode pad 1111, 1112, 1113, and 1114, respectively. In addition, each the heat radiation layer 28 is connected to each the first heat radiation pad 118. In this manner, the LED module wafer AB having the flexible wiring wafer 100aa and the one LED package wafer AA including a plurality of the surface mounting type LED package on the flexible wiring wafer 100aa is prepared. FIG. 1 A shows the LED module wafer AB.

Subsequent to the above step, the step of forming a plurality of grooves 70 by the dicing blade is performed. Consequently, each one of the surface mounting type LED package A is spaced from each the other of the surface mounting type LED package A by the grooves 70. Each the groove 70 has a depth which is equal to the thickness of the LED package wafer AA. That is, each the groove 70 has a depth such that the groove reaches the upper surface of the flexible wiring substrate 100aa. Consequently, as shown in FIG. 1 B, the LED module wafer AB having a plurality of the grooves 70 is prepared. The LED module wafer AB is appropriately cut along the groove 70 by the dicing blade. As a result, the LED module B which is prepared by cutting the LED module wafer AB has a plurality of the surface mounting type LED packages A. In this manner, the LED module B having a predetermined shape is obtained.

As mentioned above, the LED module B in this embodiment is obtained by cutting the LED module wafer AB having the LED package wafer and the flexible wiring wafer. In addition, when the LED module wafer is cut along the groove of the LED module wafer, the LED module B having a desired shape and having a plurality of the surface mounting type LED package A is obtained. For example, when the LED module wafer is cut along the groove of the LED module, it is possible to obtain the LED module B having the surface mounting type LED packages A which are arrayed in three rows and three columns. In this case, the LED module B comprises a plurality of the first lengthwise wirings, a plurality of the first widthwise wirings, a plurality of the second lengthwise wirings, and a plurality of the second widthwise wirings. In addition, when the LED module wafer is cut along the groove, it is possible to obtain the LED module B having a plurality of the surface mounting type LED packages A arranged along in a row. In this case, the LED module B comprises one the first lengthwise wiring, a plurality of the widthwise wirings, one the second lengthwise wiring, and a plurality of the widthwise wirings.

Figure 7:
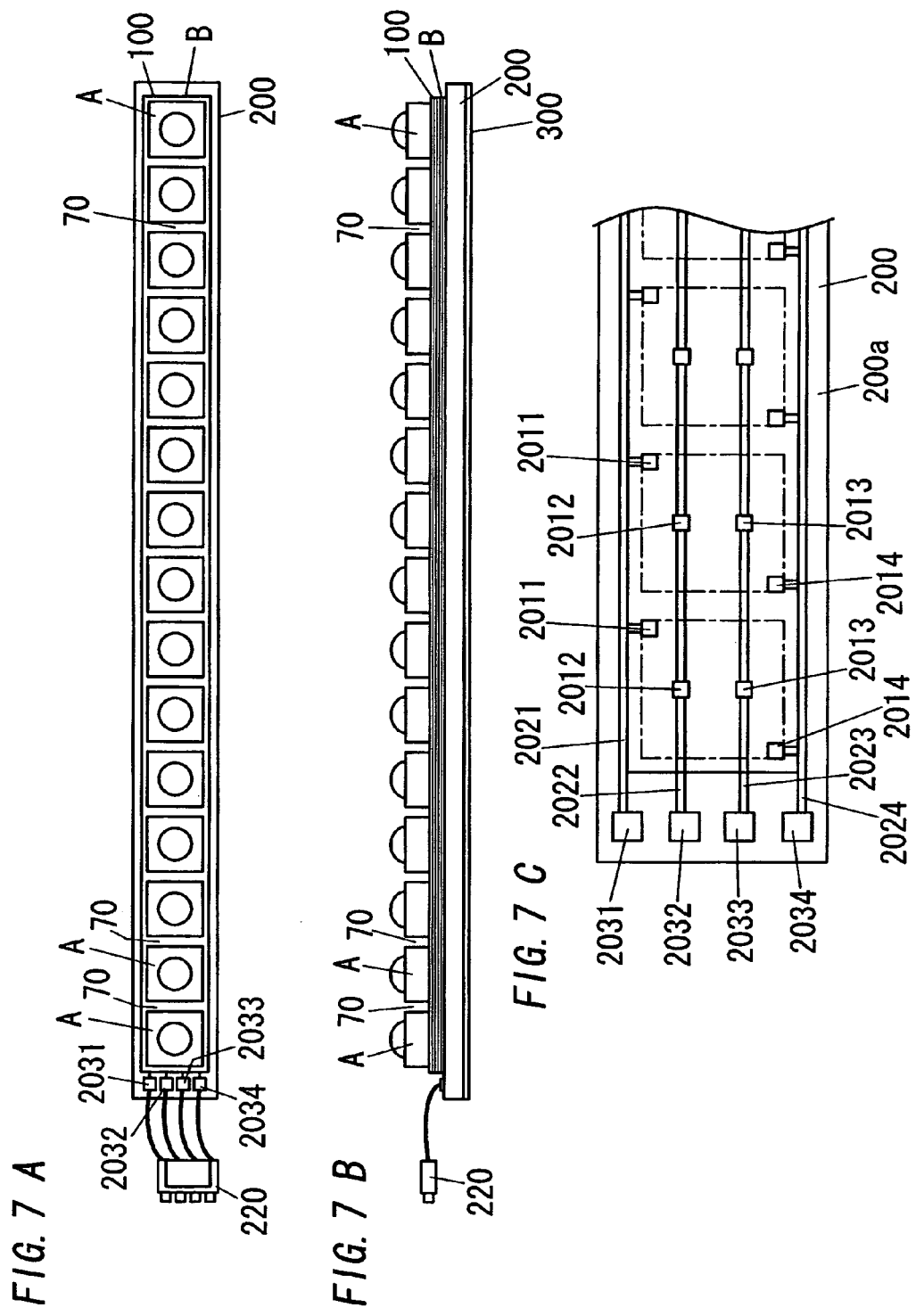
FIG. 7 A shows a top view of the LED module and the wiring substrate in the first embodiment.

FIG. 7 shows a usage example of the LED module B having a linear shape. As will be understood from FIG. 7, the LED module B is connected to the wiring substrate 200. FIG. 7 C shows a top view of the wiring substrate 200. The wiring substrate 200 shown in FIG. 7 C comprises a polyimide film 200a, four wirings, a plurality of the connection terminals, and four input terminals. The polyimide film 200A has flexibility.

A plurality of the connection terminals comprises a connection terminal 2011, a connection terminal 2012, a connection terminal 2013, and a connection terminal 2014. A plurality of the connection terminals 2011, 2012, 2013, 2014 are disposed on an upper surface of the polyimide film 200a, as shown in FIG. 7 C. Furthermore, as will be understood from FIG. 7 C, the connection terminals 2011, 2012, 2013, 2014 are disposed to have an arrangement which corresponds to an arrangement of the terminal electrodes 1511, 1512, 1513, 1514 on the lower surface of the LED module B.

The four input terminal comprise an input terminal 2031, 2032, 2033, 2034.

The four wirings comprises the wiring 2021, 2022, 2023, 2024. Each one of the wirings 2021, 2022, 2023, 2024 extends along a lengthwise direction of the wiring substrate 200. The wiring 2021 is connected to the input terminal 2031 through a first end of the wiring 2021. The wiring 2021 is connected to a plurality of the connection terminal 2011 through a plurality of the portions of the wiring 2021. The wiring 2022 is connected to the input terminal 2032 through the first end of the wiring 2022. The wiring 2022 is connected to a plurality of the connection terminals 2012 through a plurality of portions of the wiring 2022. The wiring 2023 is connected to the input terminal 2033 through a first end of the wiring 2023. The wiring 2023 is connected to a plurality of the connection terminals 2013 through a plurality of portions of the wiring 2023. The wiring 2024 is connected to the input terminal 2034 through a first end of the wiring 2024. The wiring 2024 is connected to a plurality of the connection terminal 2014 through a plurality of portions of the wirings 2024.

The connector 220 is connected to each one of the input terminals 2031, 2032, 2033, and 2034. The connector 220 is connected to the power source which is disposed in an outside.

When the connector 220 is connected to the power source, the electrical current is supplied to the LED module B through the input terminal 2032, the wiring 2022, and the connection terminal 2012. Subsequently, the electrical current flows through the terminal electrode 1512, the penetration wiring 163, the penetration wiring 24c, and the bonding wire 14, whereby the electrical current flows from the upper surface of the LED chip 1 to the lower surface of the LED chip 1. Subsequently, the electrical current flows from the lower surface of the LED chip 1 through the penetration wiring 24b, the penetration wiring 162, the terminal electrode 1513, to the connection terminal 2013. Finally, the electrical current flows to the input terminal 2033 through the connection terminal 2013 and the wiring 2023. In this manner, each one of the LED chips 1 receives the electrical current from the power source disposed in the outside, whereby each one of the LED chips 1 emits the light.

In addition, when the electrical current flows to the LED chip 1, the LED chip 1 generates the heat. The heat is transferred to the heat radiation layer 28 through the thermal via 26. The heat in the heat radiation layer 28 is transferred to the flexible wiring substrate 100 through the first heat radiation pad 118. The heat in the flexible wiring substrate 100 is transferred to the lighting device which holds the flexible wiring substrate 100 through the second heat radiation pad 158. Consequently, the heat generated in the LED chip 1 is transferred to the outside of the surface mounting type LED package A through the thermal via 26.

Figure 8:
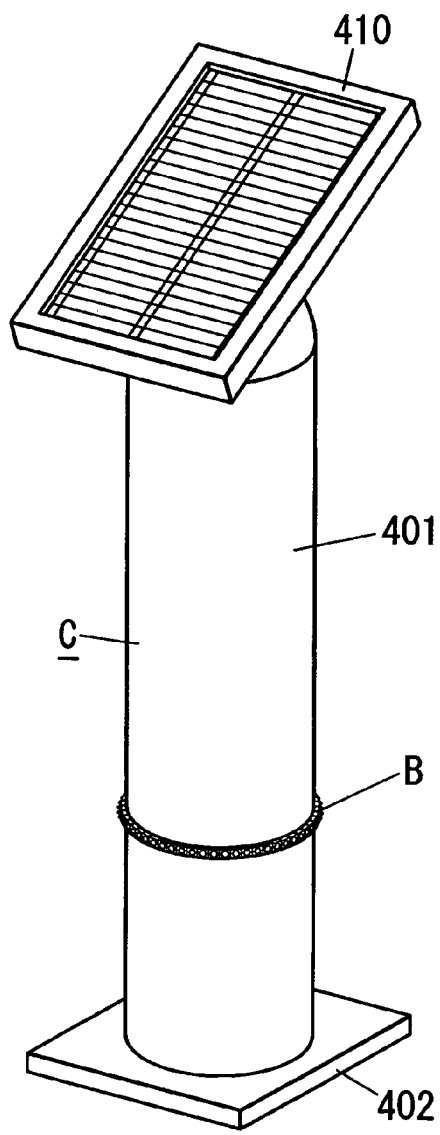
FIG. 8 A shows a perspective view of the lighting device in the first embodiment.
Figure 8:
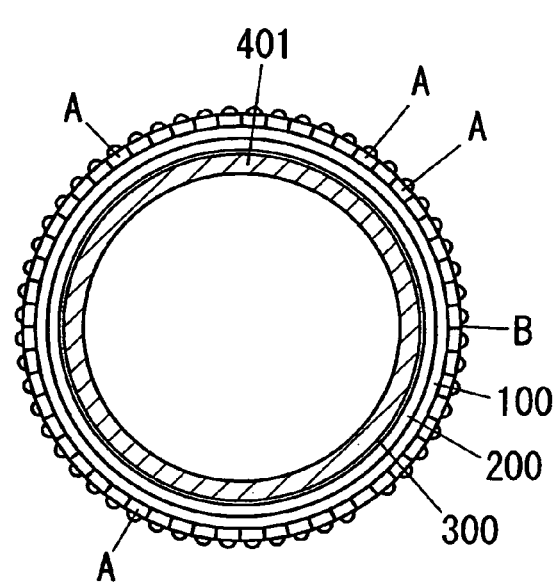

The LED module B mounted on the wiring substrate 200 is attached to the lighting device C shown in FIG. 8 A. As shown in FIG. 8 A, the lighting device C comprises a pole 401 and a solar cell module 410. In addition, the lighting device C further comprises a rechargeable battery and an output terminal each of which is not shown in the figure. The solar cell module 410 is attached to an upper end of the pole 401. The lower end of the pole 401 is supported by the base 402. The rechargeable battery is incorporated into the pole 401. The rechargeable battery is configured to store the electrical power which is generated in the solar cell module 410. An output terminal is disposed on a surface of the pole 401. The output terminal is shaped to be connectable with respect to the connector 220.

The LED module B in this embodiment is attached to the lighting device C by the bonding sheet 300 such that the LED module B is wrapped around the outer surface of the pole 401. FIG. 8 B shows a top cross sectional view of the pole 401 and the LED module B which is wrapped around the pole 401. The connector 220 is connected to the output terminal. Consequently, the LED module B receives electrical current from the rechargeable battery. As a result, the LED chip 1 generates the light.

In addition, in the LED module B in this embodiment, the surface mounting type LED package A comprise a thermal via 26 and a heat radiation layer 28. The heat radiation layer 28 is disposed on a rear surface of the mounting substrate 2. The thermal via 26 is disposed in the base 20 such that the thermal via 26 penetrates through the base 20 in the thickness direction of the base 20. In addition, the front end of the thermal via 26 is thermally coupled to the LED chip 1. The rear end of the thermal via 26 is connected to the flexible wiring substrate 100 through the first heat radiation pad 118. Therefore, when the LED chip emits the light, the LED chip generates the heat. The heat is released to the flexible wiring substrate through the thermal via 26. Therefore, it is possible to prevent LED chip from retaining the heat.

Second Embodiment

The LED module B in the second embodiment is explained with attached drawings. It should be noted that the components in common with the components of the first embodiment is symbolized by the same reference numerals. Therefore, explanations of the components in common with the components of the first embodiment are omitted.

Figure 9:
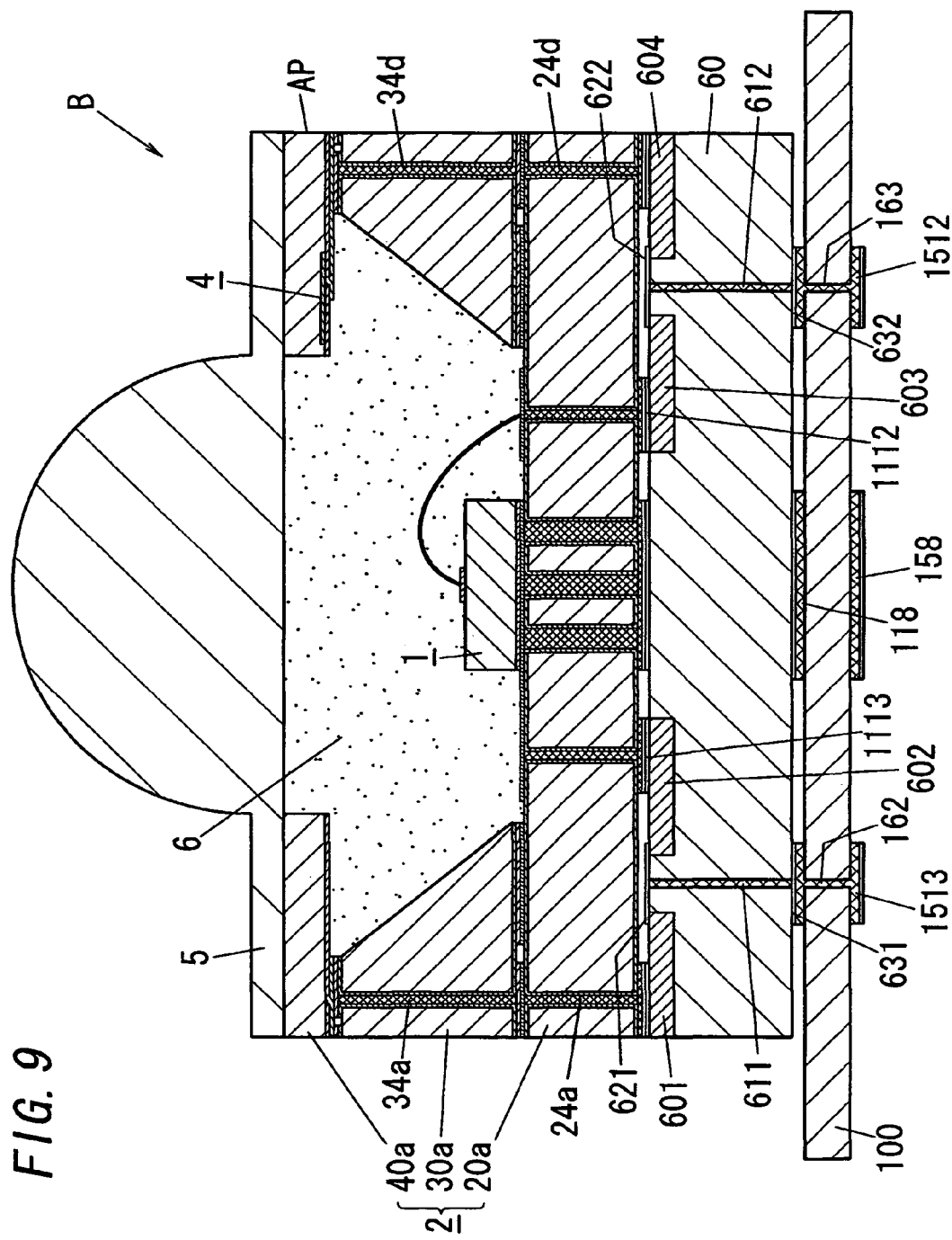
FIG. 9 shows a side cross sectional view of the LED module in the second embodiment.

FIG. 9 shows an LED module B in this embodiment. The LED module B in this embodiment comprises the flexible wiring substrate 100 and the surface mounting type LED package AP.

The surface mounting type LED package AP comprises a mounting substrate 2, the LED chip 1, the sealing material 6, the cover 5, the wirings, and the electrical current regulation circuit substrate 60.

The electrical current regulation circuit substrate 60 is made of silicon. The electrical current regulation circuit substrate 60 is provided at its front surface and its rear surface with an electrical insulation film which is not shown in the drawing. The electrical current regulation circuit substrate 60 is provided at its front surface with an electrical current regulation circuit 604, 603, 602, and 601. Each one of the electrical current regulation circuit 604, 603, 602, and 601 is spaced from the other of the electrical current regulation circuit 604, 603, 602, 601. In addition, the electrical current regulation circuit substrate is provided at its front surface with a wiring 621 and a wiring 622. The wiring 621 is formed to electrically connect the electrical current regulation circuit 604 to the electrical current regulation circuit 603. The wiring 622 is formed to electrically connect the electrical current regulation circuit 602 to the electrical current regulation circuit 601. In contrast, the electrical current regulation circuit substrate 60 is provided at its rear surface with a rear electrode 631 and a rear electrode 632. Furthermore, the electrical current regulation circuit substrate 60 is provided with a penetration wiring 611 and a penetration wiring 612. The penetration wiring 612 penetrates through the electrical current regulation circuit substrate 60 in the thickness direction of the electrical current regulation circuit substrate 60. The penetration wiring 611 is connected to the wiring 621 through a front end of the penetration wiring 611. The penetration wiring 611 is connected to the rear electrode 631 through a rear end of the penetration wiring 611. Similarly, the penetration wiring 612 is connected to the wiring 622 through the front end of the penetration wiring 612. The penetration wiring 612 is connected to the rear electrode 632 through the rear end of the penetration wiring 612. It should be noted that both the penetration wiring 611 and the penetration wiring 612 are electrically insulated from the electrical current regulation circuit substrate 60 by the electrical insulation film which is not shown in the drawing.

The base 20 is disposed on the upper surface of the electrical current regulation circuit substrate 60. Consequently, the electrical current regulation circuit 604 is connected to the connection electrode 274. The electrical current regulation circuit 603 is connected to the connection electrode 273. The electrical current regulation circuit 602 is connected to the connection electrode 272. The electrical current regulation circuit 601 is connected to the connection electrode 271.

The mounting substrate 2 is disposed on the upper surface of the flexible wiring substrate 100. Consequently, the electrode pad 1113 is connected to the rear electrode 631. The electrode pad 1112 is connected to the rear electrode 632. The LED module B is mounted on the wiring substrate 200 shown in FIG. 10 C. Each the FIG. 10 A and FIG. 10 B shows the wiring substrate 200 having the surface mounting type LED package AP.

When the connector 220 is connected to the power source disposed in the outside, the electrical current is supplied to the LED module B through the input terminal 2032, the wiring 2022, and the connection terminal 2012. Subsequently, the electrical current flows through the terminal electrode 1512, the penetration wiring 163, the penetration wiring 612, the penetration wiring 24c, and the bonding wire 14, whereby the electrical current flows from the upper surface of the LED chip 1 to the lower surface of the LED chip 1. Subsequently, the electrical current flows from the lower surface of the LED chip 1, through the penetration wiring 24b, the penetration wiring 611, the penetration wiring 162, and the terminal electrode 153 to the connection terminal 2013. Finally, the electrical current flows to the input terminal 2033 through the connection terminal 2013 and the wiring 2023. In this manner, the LED module B receives the electrical current from the power source disposed in the outside, whereby the LED module B emits the light.

When the light is emitted from the LED chip, the light detection element 4 which is realized by the photo diode is irradiated by the light. The light detection element 4 is configured to detect an amount of the light which is emitted from the LED chip 1, and generate a detected electrical current corresponding to an amount of the light detected by the light detection element 4. The detected electrical current flows to the electrical current regulation circuit 604. The electrical current regulation circuit 604 is configured to regulate an amount of the light which is applied to the LED chip 1 on the basis of the electrical current applied to the electrical current regulation circuit 604. Specifically, when the electrical current regulation circuit 604 receives a large amount of the electrical current, the electrical current regulation circuit 604 decreases the electrical current which is applied to the LED chip 1. In contrast, when the electrical current regulation circuit 604 receives a low amount of the electrical current, the electrical current regulation circuit 604 increases the electrical current which is applied to the LED chip 1. In this manner, an amount of the light which is emitted from the LED chip 1 is regulated by the light detection element 4 and the electrical current regulation circuit 604. In addition, in each the surface mounting type LED package A, the electrical current regulation circuit 604 is configured to regulate an amount of the light which is emitted from the LED chip 1. Therefore, each one of the LED chips 1 is configured to emit the light having an amount of the light which is equal to an amount of the light which is emitted from the other of the LED chip 1. That is, each one of the surface mounting type LED package A comprises the electrical current regulation circuit 604. Therefore, each the LED chip 1 is configured to emit the light having a uniform amount of the light. Therefore, in the LED module being cut to have a desired shape with a plurality of the surface mounting type LED package, it is possible to prevent each one of the LED chip 1 from emitting the light having an amount of the light which is different from an amount of the light which is emitted from the other of the LED chip 1.

In contrast, it is preferred that the lighting device C having the LED module B is provided with a controller. The controller is configured to regulate the electrical current which is flown to the LED module B such that the LED module emits the light having a predetermined amount of the light. According to this configuration, the LED module B is installed on the wiring substrate 200 shown in FIG. 7. When the LED module B is installed on the wiring substrate 200, the penetration wiring 162 is formed such that the penetration wiring 162 is connected to the electrical current regulation circuit substrate 602 and also the electrode pad 162. The penetration wiring 163 is formed such that the penetration wiring 163 is connected to the electrical current regulation circuit 603 and also the electrode pad 163. Furthermore, the electrical current regulation circuit substrate 60 comprises a penetration wiring which connects the electrical current regulation circuit 604 to the electrode pad 164, and a penetration wiring which connects the electrical current regulation circuit 601 to the electrode pad 161.

FIG. 7 shows a wiring substrate 200 and the LED module B which is mounted on the wiring substrate 200. The wiring substrate 200 is connected to the rechargeable battery and the controller of the lighting device C through the connector 220.

When the LED chip 1 receives the electrical current, the light detection element 4 detects an amount of the light which is emitted from the LED chip 1. The light detection element 4 generates the electrical current according to an amount of the light which is detected by the light detection element 4. The electrical current is flown to the controller of the lighting device C through the connector 220. The controller is compares an amount of the light which is emitted from the LED chip with a predetermined value on the basis of the electrical current which is generated and flown by the light detection element 4. If an amount of the light detected by the light detection element is greater than a predetermined value, the controller decreases the electrical current which is supplied to the LED module B. Consequently, the controller decreases an amount of the light which is emitted from the LED module B. In contrast, if the light detection element 4 detects an amount of the light which is lower than a predetermined value, the controller increases an amount of the electrical current supplied to the LED module B. Consequently, the controller increases an amount of the light which is emitted from the LED module B. In this manner, it is possible to obtain the lighting device C being configured to emit the light having a constant amount.

Third Embodiment

Figure 11:
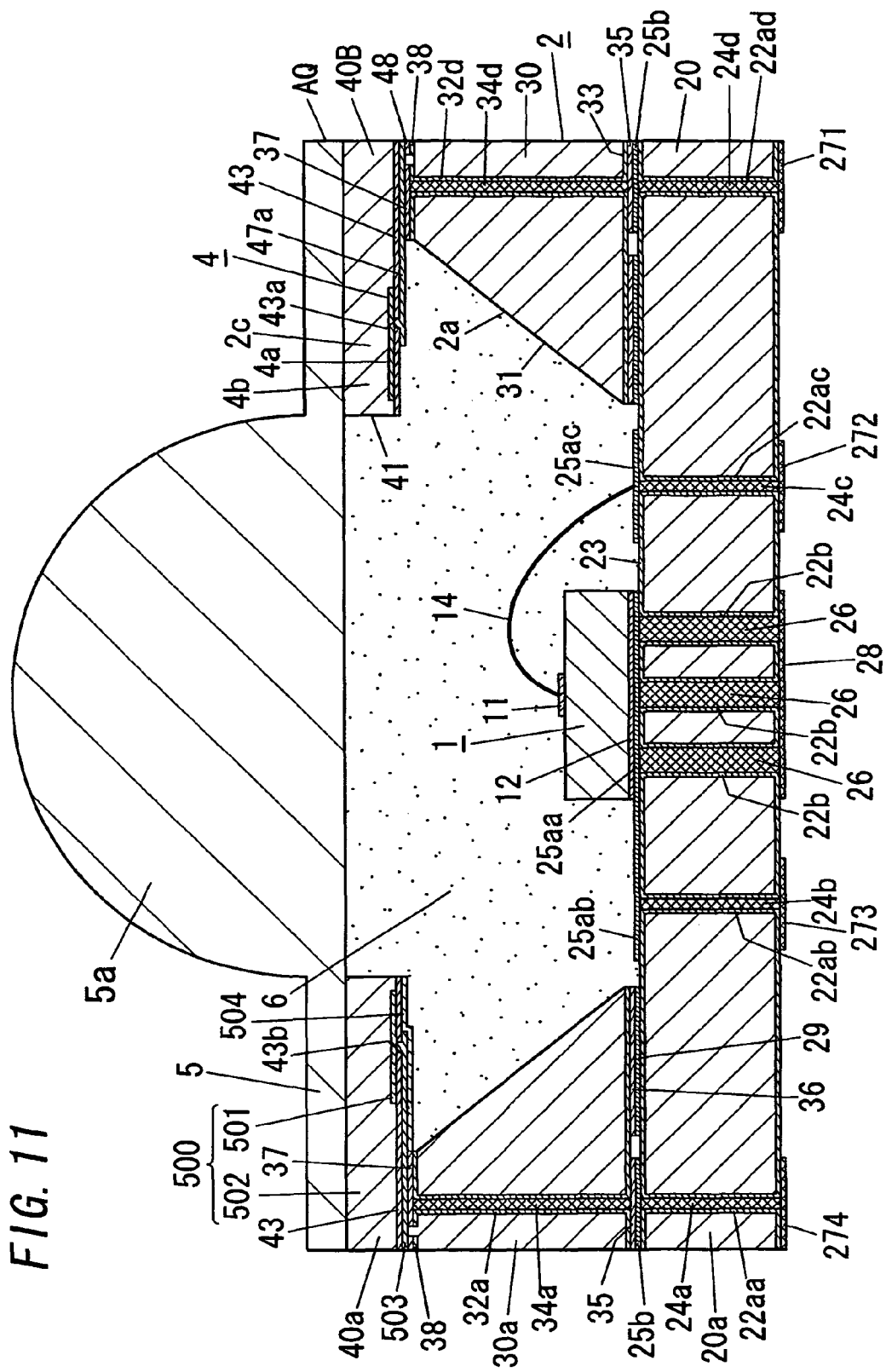
FIG. 11 show a side cross sectional view of the surface mounting type LED package in the third embodiment.

The LED module in the third embodiment of this invention is explained with attached drawings. It is noted that the components in common with the components of the first embodiment and the second embodiment is symbolized by the same reference numerals. Therefore, the explanation of the components in common with the components of the first embodiment and the second embodiment is omitted. As shown in FIG. 11, the LED module B in this embodiment comprises a surface mounting type LED package AQ and a flexible wiring substrate 10.

The surface mounting type LED package AQ comprises a mounting substrate 2, an LED chip 1, a sealing material 6, a cover 5, and wirings.

The mounting substrate 2 comprises a base 20, a spacer 30, and a frame 40B. The frame 40B is disposed on an upper surface of the spacer 30. The frame 40B is formed at is center with an aperture 41. The aperture 41 penetrates through the frame 40B in the thickness direction of the frame 40B. The frame 40B is provided at its lower surface with a light detection element 4 and a wiring 38. The aperture 41 is in communication with the opening 31. The aperture 41 has a dimension which is smaller than a dimension of the opening 31. Consequently, the inside circumference of the frame 40B has a projection portion 2c. The projection portion 2c is projected inwardly of the inside circumference of the spacer 30. The frame 40B is provided at its lower surface of the projection portion 2c with a light detection element 4 and a temperature detection element 500. The frame is provided at its lower surface with a wiring 47a. The wiring 47a electrically connects the light detection element 4 to the penetration wiring 34d. The temperature detection element 500 is disposed on the projection portion 2c such that the temperature detection element 500 is spaced from the light detection element 4.

The light detection element 4 comprises a photo diode which has a p-type region 4a and an n-type region. The p-type region 4a is electrically connected to the wiring 47a. The n-type region is disposed adjacent to the p-type region. The n-type region is electrically connected to the wiring 47b.

The temperature detection element 50 also comprises a p-type region 501 and an n-type region 502, similar to the photo diode. In addition, the temperature detection element further comprises a light shielding structure. The light shielding structure is configured to prevent the irradiation of the light to the temperature detection element. The p-type region 501 is electrically connected to the wiring 503. The n-type region 502 is connected to the wiring (such as reference numeral 505 in FIG. 19). The p-type region 501 of the light detection element 4 has a size which is equal to a size of the p-type region 4a of the temperature detection element 500. In addition, p-type region 4a of the light detection element 4 has an impurity concentration which is equal to an impurity concentration of the p-type region of the temperature detection element 500. The p-type region 4a of the light detection element 4 is electrically insulated from the p-type region 501 of the temperature detection element by the insulation layer which is not shown. The light shielding structure 504 is provided for prevention of the irradiation of the light which is emitted from the LED chip 1 to the temperature detection element. Specifically, the light shielding structure 504 is disposed on the lower surface of the frame 40a such that the light shielding structure 504 covers the lower surface of the temperature detection element 500.

The temperature detection element 500 is also disposed on the lower surface of the projection portion 2c. Therefore, the distance between the LED chip 1 and the temperature detection element 500 is equal to the distance between the LED chip 1 and the light detection element 4.

The LED module B explained above is also disposed on the upper surface of the wiring substrate 200 shown in FIG. 7. When the connector 220 is connected to the power source disposed in the outside, the electrical current flows to the LED module B through the input terminal 2032, the wiring 2022, and the connection terminal 2012. Subsequently, the electrical current flows from the upper surface of the LED chip 1 to the lower surface of the LED chip 1 through the terminal electrode 1512, the penetration wiring 163, the penetration wiring 24c, and the bonding wire 14. Subsequently, the electrical current flows from the lower surface of the LED chip 1 to the connection terminal 2013 through the penetration wiring 24b, the penetration wiring 162, and the terminal electrode 1513. Finally, the electrical current flows to the input terminal 2033 through the connection terminal 2013 and the wiring 2023. In this manner, the LED module B receives the electrical current from the power source disposed in the outside, whereby the LED module B emits the light.

The light which is emitted from the LED chip 1 is detected by the light detection element 4 which is realized by the photo diode. When the light detection element 4 detects the light, the light detection element 4 generates the detected electrical current which corresponds to an amount of the light detected by the light detection element 4, and applies the detected electrical current to the connection electrode 271 through the penetration wiring 34d and the penetration wiring 24d. When the detected electrical current is flown to the connection electrode 271, the detected electrical current is flown to the connection terminal 2014 through the terminal electrode 1511. The electrical current flown to the connection terminal 2014 is applied to the controller through the wiring 2024 and the input terminal 2034. In contrast, the light shielding structure prevents the irradiation of the light emitted by the LED chip 1 to the temperature detection element 500. Therefore, there is no possibility that the light emitted from the LED chip 1 causes the temperature detection element 500 to generate the electrical current.

In contrast, when the LED chip 1 receives the electrical current, the LED chip 1 emits the light, and also generates the heat. The heat in the LED chip 1 is transferred to the temperature detection element through the base 20, the spacer 30, and the frame 40B. When the p-type region of the temperature detection element 500 has temperature which is different from temperature of the n-type region of the temperature detection element 500, the temperature detection element generates the electrical current. When the temperature detection element 500 generates the electrical current, the electrical current is flown to the connection electrode 274 through the penetration wiring 34a and the penetration wiring 24a. The electrical current which is flown to the connection electrode 274 is flown to the terminal electrode 1514 through the penetration wiring 24a. The electrical current which is flown to the terminal electrode 1514 is flown to the controller through the connection terminal 2011, wiring 2021, and the input terminal 2031. The controller calculates the temperature of the LED chip 1 on the basis of the electrical current which is flown to the connection terminal 2011.

The controller calculates an accurate light amount on the basis of "the electrical current which is frown from the input terminal 2034" and "the temperature of the LED chip 1". The controller regulates the electrical current which is supplied to the LED module B on the basis of the accurate light amount. Specifically, when the electrical current which is flown to the controller is greater than a predetermined value, the controller decreases an amount of the electrical current supplied to the LED module B. Consequently, an amount of the light emitted from the LED module B is decreased. In contrast, when the electrical current which is flown to the controller is lower than a predetermined value, the controller increases an amount of the electrical current supplied to the LED module B. Consequently, an amount of the light which is emitted from the LED module B is increased. In this manner, the LED module B in this invention is configured to emit the light having a constant amount.

In addition, the temperature detection element 500 and the light detection element 4 are disposed on the projection portion 2c. Therefore, the distance between the LED chip 1 and the temperature detection element 500 is equal to the distance between the LED chip 1 and the light detection element 4. Thus, "the heat generated in the LED chip 1 when the LED chip 1 emits the light" is transferred to the light detection element 4 and the temperature detection element 500, similarly. That is to say, the temperature which is detected by the temperature detection element 500 is also recognized as the light detection element 4. Therefore, it is possible for the temperature detection element 500 to detect the temperature of the light detection element 4 accurately. Consequently, the controller is configured to regulate an amount of the electrical current to an appropriate value on the basis of "an amount of the light detected by the light detection element 4" and "the temperature of the light detection element 4", whereby the electrical current having the appropriate value is flown to the LED chip 1. Especially, the controller is configured to easily detect "an amount of the light which is emitted from the LED chip 1 accurately" on the basis of the difference between "the electrical current which is flown from the temperature detection element 500" and "the electrical current which is flown from the light detection element 4".

Figure 19:
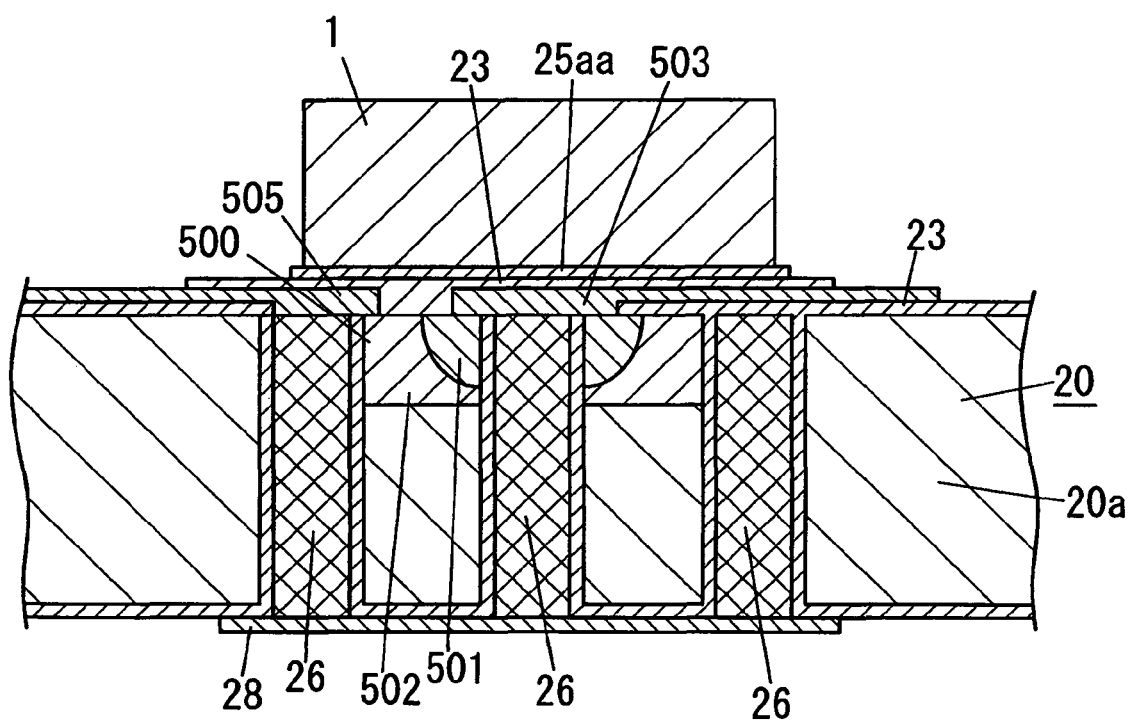
FIG. 19 shows a temperature detection element of another embodiment.

It goes without saying that it is possible to dispose the temperature detection element 500 in the front surface of the base 20. FIG. 19 shows a first modification of this embodiment. In this modification, the temperature detection element 500 is disposed on a center of the front surface of the base 200. Consequently, the temperature detection element 500 is disposed in a position immediately below the LED chip. In addition, the p-type region 501 of the temperature detection element 500 is thermally coupled to the thermal via 26 which is one of the thermal vias 26 and which is located at a center in the thermal vias 26. In contrast, the n-type region 502 of the temperature detection element 500 is connected to all thermal vias.

That is to say, in the LED module of this modification, the surface mounting type LED package comprises a plurality of the thermal vias and a heat radiation layer. The heat radiation layer is disposed on the rear surface of the mounting substrate. Each one of the thermal vias is disposed in the mounting substrate such that each one of the thermal vias penetrates through the mounting substrate through the thickness direction of the mounting substrate. Consequently, each one of the thermal vias thermally couples the LED chip to the heat radiation layer. The thermal via is made of metal. Each one of the thermal vias are electrically insulated from the other of the thermal vias. The flexible wiring substrate comprises a first heat radiation pad and a second heat radiation pad. The first heat radiation pad is formed on the front surface of the flexible wiring substrate. The second heat radiation pad is formed on the rear surface of the flexible wiring substrate. The surface mounting type LED package is mounted on the flexible wiring substrate such that the first heat radiation pad is in contact with the heat radiation layer. The first heat radiation pad is aligned to the second heat radiation pad in the thickness direction of the flexible wiring substrate. A plurality of the thermal via comprises a first thermal via and a second thermal via. The temperature detection element comprises a p-type region and an n-type region. The p-type region is connected to the first thermal via through the electrically insulation layer. The p-type region is spaced from the thermal via. The n-type region is connected to the second thermal via through the electrically insulation layer.

With this configuration, the temperature detection element 500 is configured to detect the temperature of the LED chip 1 accurately. Therefore, the controller is configured to regulate an amount of the electrical current to an accurate value on the basis of "an amount of the light detected by the light detection element 4" and "the temperature of the LED chip 1", whereby the appropriate value of the electrical current is supplied to the LED chip 1.

The temperature detection element 500 with the above configuration assures the LED module B to emit the light having a desired color.

Fourth Embodiment

An LED module in the fourth embodiment of this invention is explained with attached drawings. It should be noted that the components in common with the components in the first embodiment is symbolized by the same reference numerals. Therefore, the explanation of the components in common with the components in the first embodiment is omitted.

Figure 12:
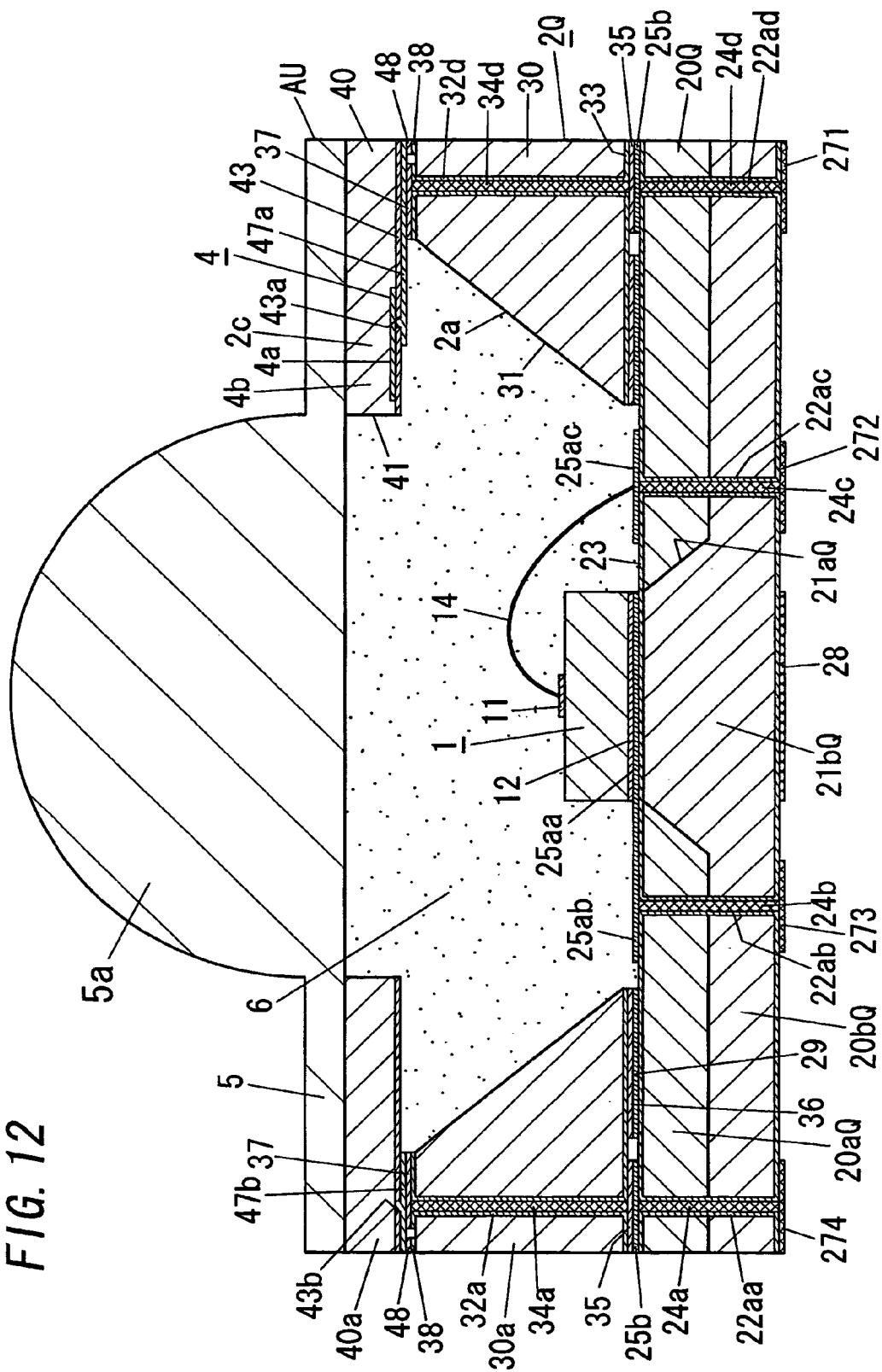
FIG. 12 shows a side cross sectional view of the surface mounting type LED package in the fourth embodiment.

FIG. 12 shows a side cross sectional view of the surface mounting type LED package AU. As shown in FIG. 12, the surface mounting type LED package AU comprises a mounting substrate 2Q, an LED chip 1, a sealing 6, a cover 5, and wirings.

The mounting substrate 2Q comprises a base 20Q, a spacer 30, and a frame 40. The base 20Q comprises a silicon substrate 20aQ and a metal substrate 20bQ. The silicon substrate 20aQ is defined as a first base. The metal substrate 20bQ is defined as a second base. The silicon substrate 20aQ is formed at its center with an opening 21aQ. Therefore, the silicon substrate 20aQ is formed to have a frame shape. The metal substrate 20bQ is formed to have a mount portion 21bQ. The mount portion 21bQ has a shape which corresponds to a shape o the opening 21aQ. That is to say, the silicon substrate 20aQ is defined as the first base. The metal substrate 20bQ is defined as the second base. The silicon substrate 20a is disposed on the upper surface of the metal substrate 20bQ such that the mount portion 21bQ is inserted into the opening 21aQ. Therefore, the lower surface of the metal substrate 20bQ is defined as a rear surface of the mounting substrate 2Q. In contrast, the front surface of the silicon substrate 20a is cooperative with a front surface of the mount portion 21b to define the upper surface of the base 20Q. The front surfaces and the rear surfaces of both the silicon substrate 20aQ and the metal substrate 20bQ are provided with an electrical insulation film 23. The base 20Q is provided for mounting the LED chip 1. The silicon substrate 20aQ and the metal substrate 20bQ are provided with a plurality of the through holes 22aa, 22ab, 22ac, and 22ad. The through holes 22aa, 22ab, 22ac, and 22ad penetrate through the silicon substrate 20aQ and the metal substrate 20bQ in the thickness direction of the silicon substrate 20aQ and the metal substrate 20bQ. Each one of the through holes 22aa, 22ab, 22ac, and 22ad are provided at its inside circumference surface with an electrical insulation film 23. The through holes 22aa, 22ab, 22ac, and 22ad are provided for placing the penetration wirings 24a, 24b, 24c, and 24d therein, respectively. Both the silicon substrate 20aQ and the metal substrate 20bQ are provided at their lower surfaces with contact electrodes 271, 272, 273, and 274. The contact electrodes 271, 272, 273 and 274 are electrically connected to the through hole wiring which passing through the through hole. The connection electrode 272 is electrically connected to the penetration wiring 24c. The penetration wiring 24c is electrically connected to the electrode pad 25ac disposed on the silicon substrate 20a. The connection electrode 273 is electrically connected to the penetration wiring 24b. The penetration wiring 24b is electrically connected to the wiring 25ab disposed on the upper surface of the silicon substrate 20a. The penetration wiring 24b is also electrically connected to the electrode pad 25aa. The connection electrode 274 is electrically connected to the penetration wiring 24a. The connection electrode 271 is electrically connected to the penetration wiring 24d.

The LED chip 1 is provided at its lower surface with an electrode 11, and is provided at its upper surface with an electrode 12. The LED chip 1 is disposed on the base 20 such that the electrode 12 is electrically connected to the electrode pad 25aa through the wiring 25ab. Consequently, the LED chip 1 is disposed within the recess 2a. The electrode 11 is electrically connected to the electrode pad 25ac through the bonding wire 14. When the LED chip 1 receives the electrical current through the electrodes 11 and 12, the LED chip 1 emits the light. Furthermore, as shown in FIG. 12, the LED chip 1 is disposed on the upper surface of the mount portion 21bQ through the electrical insulation film. Therefore, the LED chip 1 is thermally coupled to the mount portion 21bQ. Consequently, the LED chip 1 is thermally coupled to the heat radiation layer 28 through the metal substrate 20bQ.

In the LED module B, when the LED chip 1 emits the light, the LED chip 1 also generates the heat. This heat is transferred to the flexible wiring substrate through the metal substrate 20bQ. Therefore, it is possible to obtain the LED module B being configured to emit the light having a desired color.

Figure 20:
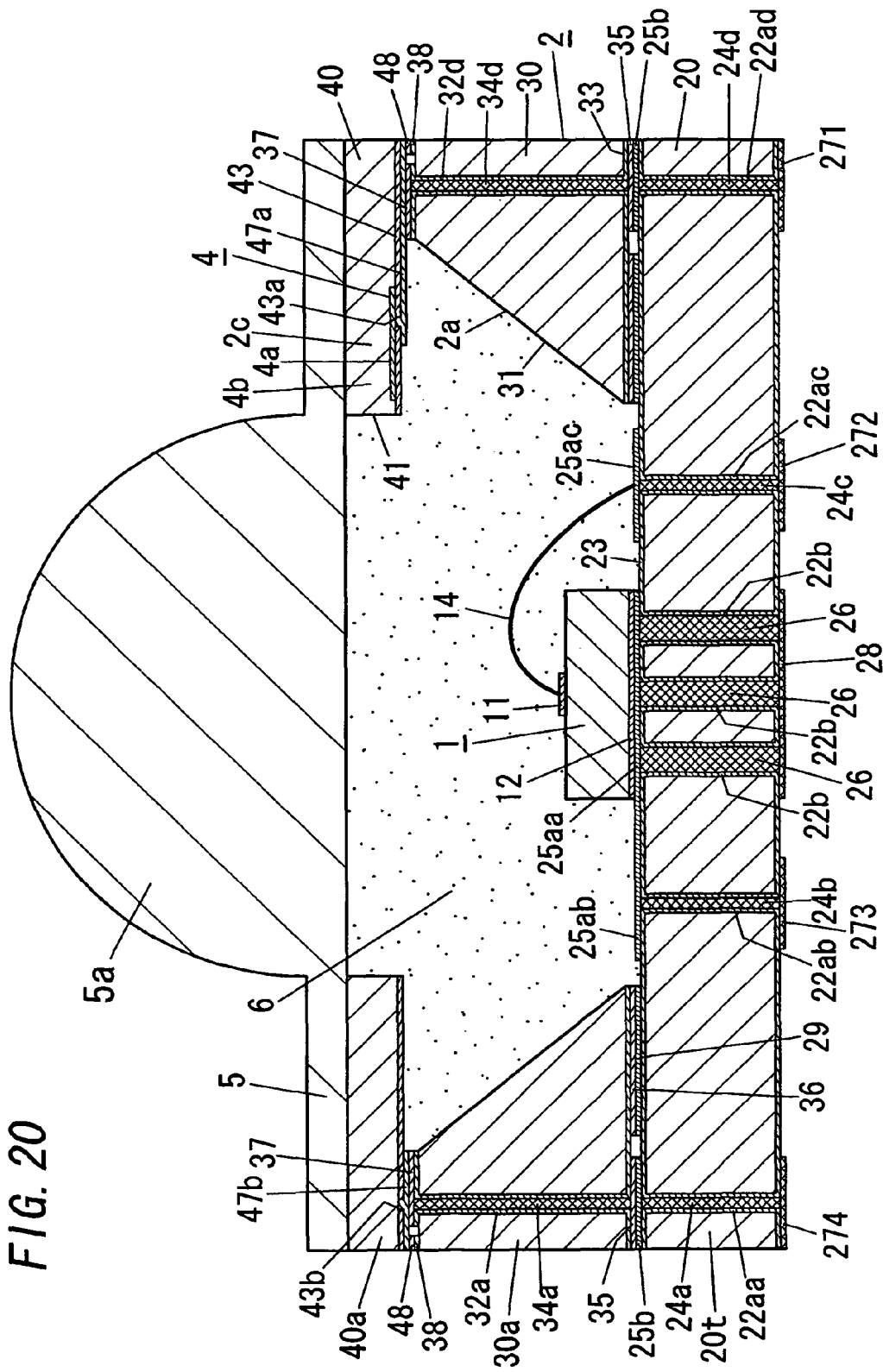
FIG. 20 shows a side cross sectional view of the surface mounting type LED package in the fourth embodiment.

In addition, it is preferred to employ the base being made of metal. FIG. 20 shows a first modification of this embodiment. As shown in FIG. 20, the base 20 in this modification comprises a metal plate 20t which is provided at its surface with an electrical insulation film 23. The metal plate 20t is made of material such as Cu and Al. The base with this configuration makes it possible to achieve the same effect.

Fifth Embodiment

The LED module in the fifth embodiment of this invention is explained with attached drawings. It is noted that the components in common with the components of the first embodiment is symbolized by the same reference numerals. Therefore, explanation of the components in common with the components of the first embodiment is omitted.

Figure 13:
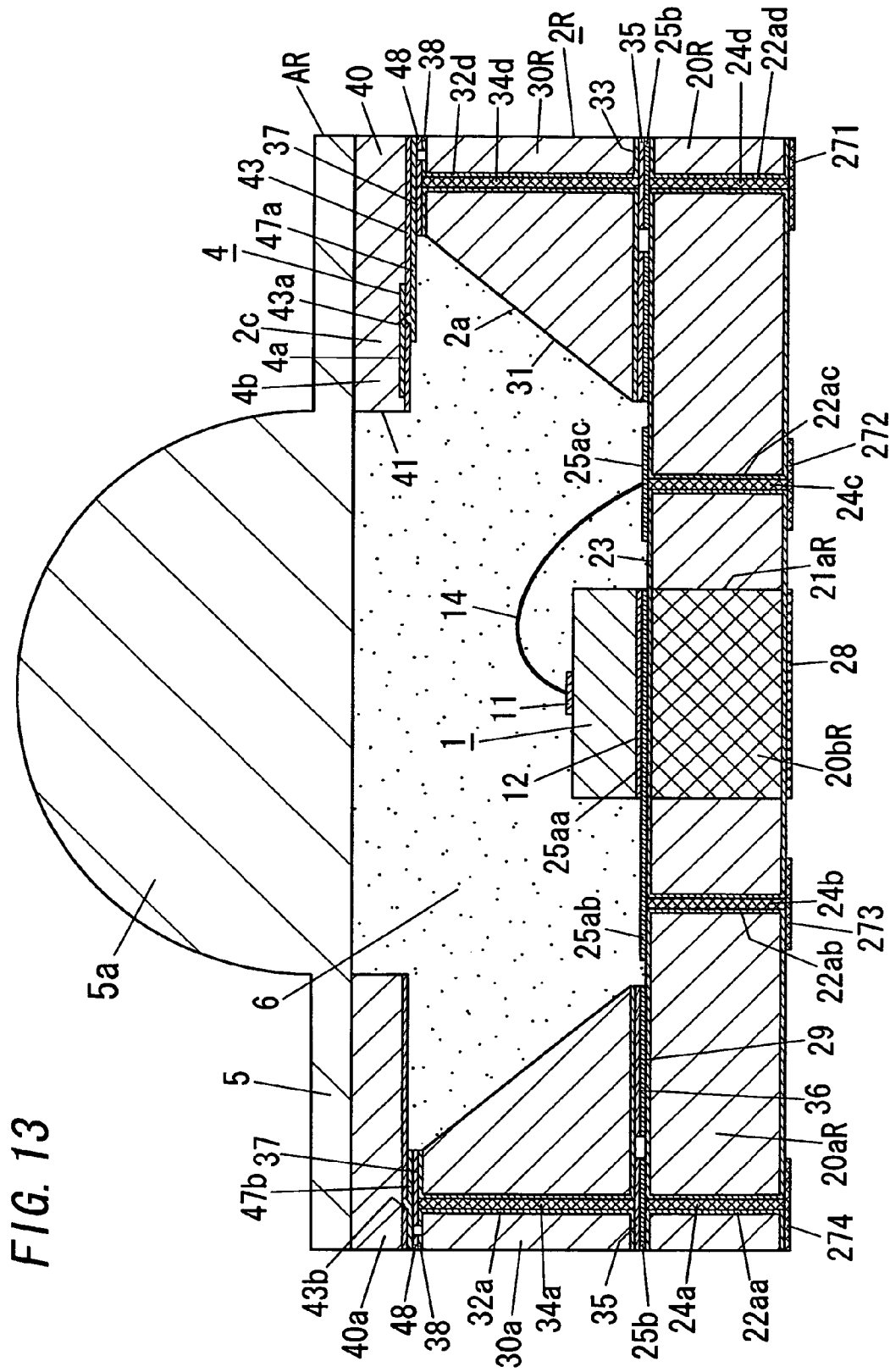
FIG. 13 shows a side cross sectional view of the surface mounting type LED package in the fifth embodiment.

FIG. 13 shows a side cross sectional view of the surface mounting type LED package AR in this embodiment. As shown in FIG. 13, the surface mounting type LED package AR comprises a mounting substrate 2R, an LED chip 1, a sealing material 6, a cover 5, and wirings.

The mounting substrate 2R comprises a base 20R, a spacer 30R, and a frame 40. The base 20R comprises a resin plate 20aR and a metal plate bR. The resin plate 20aR is made of light sensitive resin composition. The resin plate 20aR is formed at its center with an opening 21aR. The opening 21aR is penetrated through the resin plate 20aR in the thickness direction of the resin plate 20aR. The metal plate 20bR is disposed in the opening 21aR. Consequently, the metal plate 20bR penetrates through the resin plate 20aR in the thickness direction of the resin plate 20aR.

The spacer 30R is disposed on the upper surface of the base 20. The spacer 30R is made of light sensitive resin composition.

In the LED module B with this configuration, when the LED chip 1 receives the electrical current, the LED chip 1 generates the heat. The heat is transferred to the heat radiation layer 28 through the metal plate 20bR. When the heat transfer layer 28 receives the heat, the heat transfer layer 28 transfers the heat to the flexible wiring substrate 100 through the first heat radiation pad 118. When the flexible wiring substrate 100 receives the heat, the flexible wiring substrate transfers the heat to "the lighting device which holds the flexible wiring substrate 100" through the second heat radiation pad 158. In this manner, the heat generated in the LED chip 1 is released to the outside.

However, when the heat generated in the LED chip 1 is transferred to the metal plate 20bR through the heat radiation layer 28, the heat expands the meati plate 20bR. When the metal plate 20bR is expanded, the size of the metal plate 20bR is varied. That is to say, the heat varies the size of the metal plate 20bR with respect to the size of the opening 21aR. However, the resin plate 20aR is made of the light sensitive resin composition. Therefore, the resin plate 20aR has a high Young's modulus. Specifically, the resin plate 20aR has the Young's modulus which is higher than Young's modulus of the silicon substrate. Therefore, this configuration makes it possible to prevent the strain of the base 20R due to the expansion of the metal plate 20bR. In addition, the spacer 30R is made of the light sensitive resin composition. Therefore, it is possible to manufacture the spacer 30R, easily.

Sixth Embodiment

The LED module in the sixth embodiment of this invention is explained with attached drawings. It is noted that the components in common with the components in the first embodiment is symbolized by the same reference numerals. Therefore, the explanations of the components in common with the components in the first embodiment are omitted.

Figure 14:
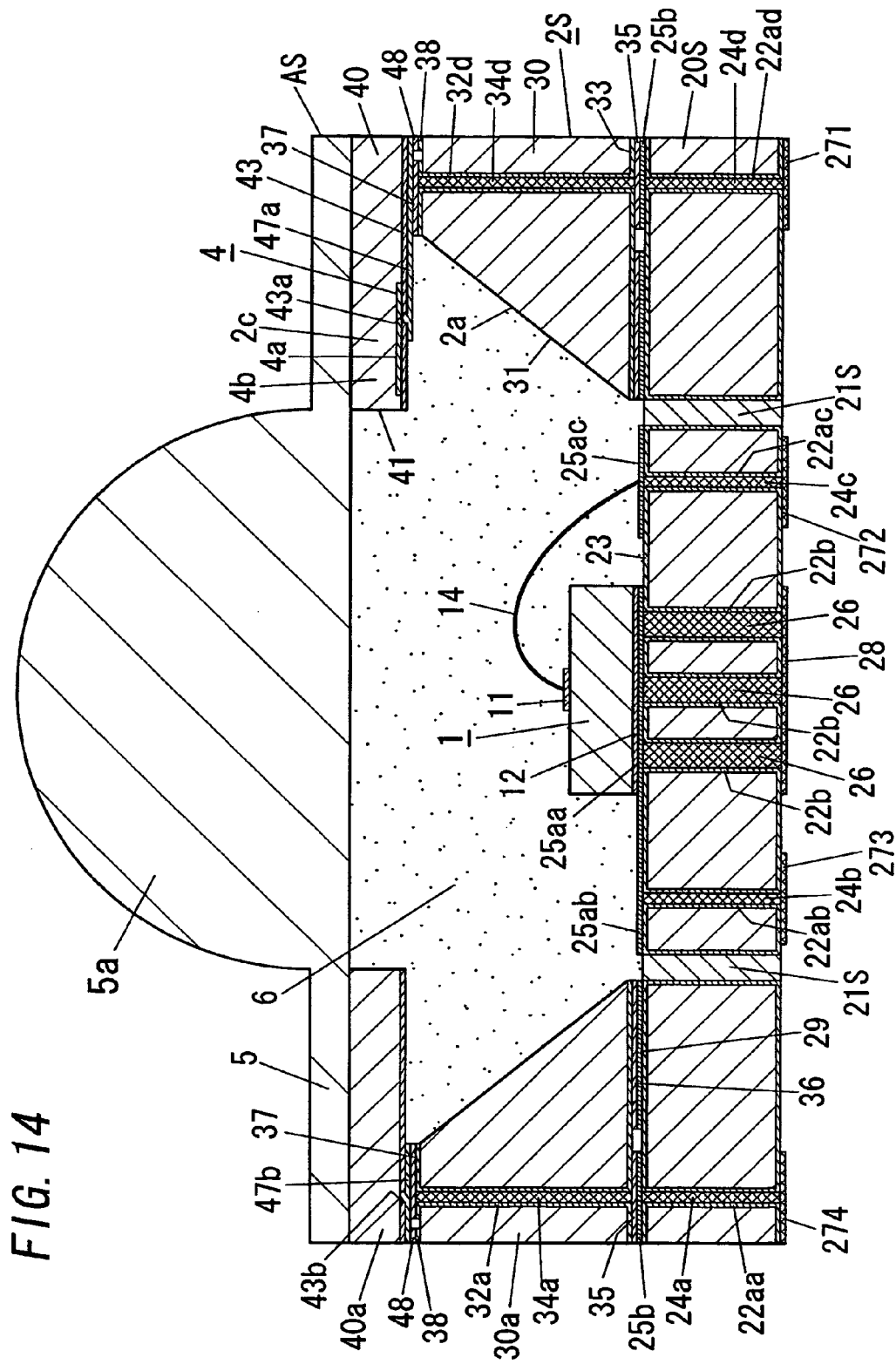
FIG. 14 shows a side cross sectional view of the surface mounting type LED package in the sixth embodiment.

FIG. 14 shows a side cross sectional view of the surface mounting type LED package AS in this embodiment. As shown in FIG. 14, the surface mounting type LED package comprises a mounting substrate 2S, the LED chip 1, the sealing material 6, the cover 5, and wirings.

The mounting substrate 2S comprises a base 20S, the pacer 30, and the frame 40. The base 20S is made from the silicon substrate 20a. The base S is provided with a heat insulation layer 21S. The heat insulation layer 21S is formed such that the heat insulation layer 21S penetrates through the silicon substrate 20a in the thickness direction of the silicon substrate. In addition, the heat insulation layer 21S is disposed in the silicon substrate 20a such that the heat insulation layer 21S surrounds an entire circumference of the LED chip 1.

The spacer 30 is disposed on the upper surface of the base 20S. As will be understood from FIG. 14, the spacer 30 has an inside circumference surface. The lower end of the inside circumference surface of the spacer 30 is located outwardly of the outer circumference of the heat insulation layer 20S. That is, the heat insulation layer 21S is disposed in the silicon substrate 20a such that the heat insulation layer 21S is located between "the LED chip" and "the lower end of the inside circumference surface of the spacer 30".

In the surface mounting type LED package with the above configuration, when the LED chip 1 receives the electrical current, the LED chip 1 generates the heat. The heat is transferred to the heat radiation layer 28 through the thermal via 26. The heat which is transferred to the heat radiation layer 28 is transferred to the flexible wiring substrate 100 through the first heat radiation pad 118. The heat which is transferred to the flexible wiring substrate 100 is transferred to "the lighting device which holds the flexible wiring substrate 100" through "the second heat radiation pad 158". Consequently, the heat generated in the LED chip 1 is released to the outside.

However, when the heat generated in the LED chip 1 is transferred to the heat radiation layer 28 through the thermal via 26, the heat in the thermal via 26 is also transferred to the silicon substrate 20a. The heat insulation layer 21S prevents the transmission of the heat in the silicon substrate 20a to the spacer 30. That is to say, the heat insulation layer 21S prevents the transmission of the heat generated in the LED chip 1 to the light detection element 4. In addition, the heat insulation layer 21S directs the heat generated in the LED chip 1 to the flexible wiring substrate 100 through the thermal via 26 and the heat radiation layer 28. Therefore, the heat generated in the LED chip 1 is not transferred to the light detection element 4 through the heat transfer path which is realized by the base 20S, the spacer 30, and the frame 40.

Figure 15:
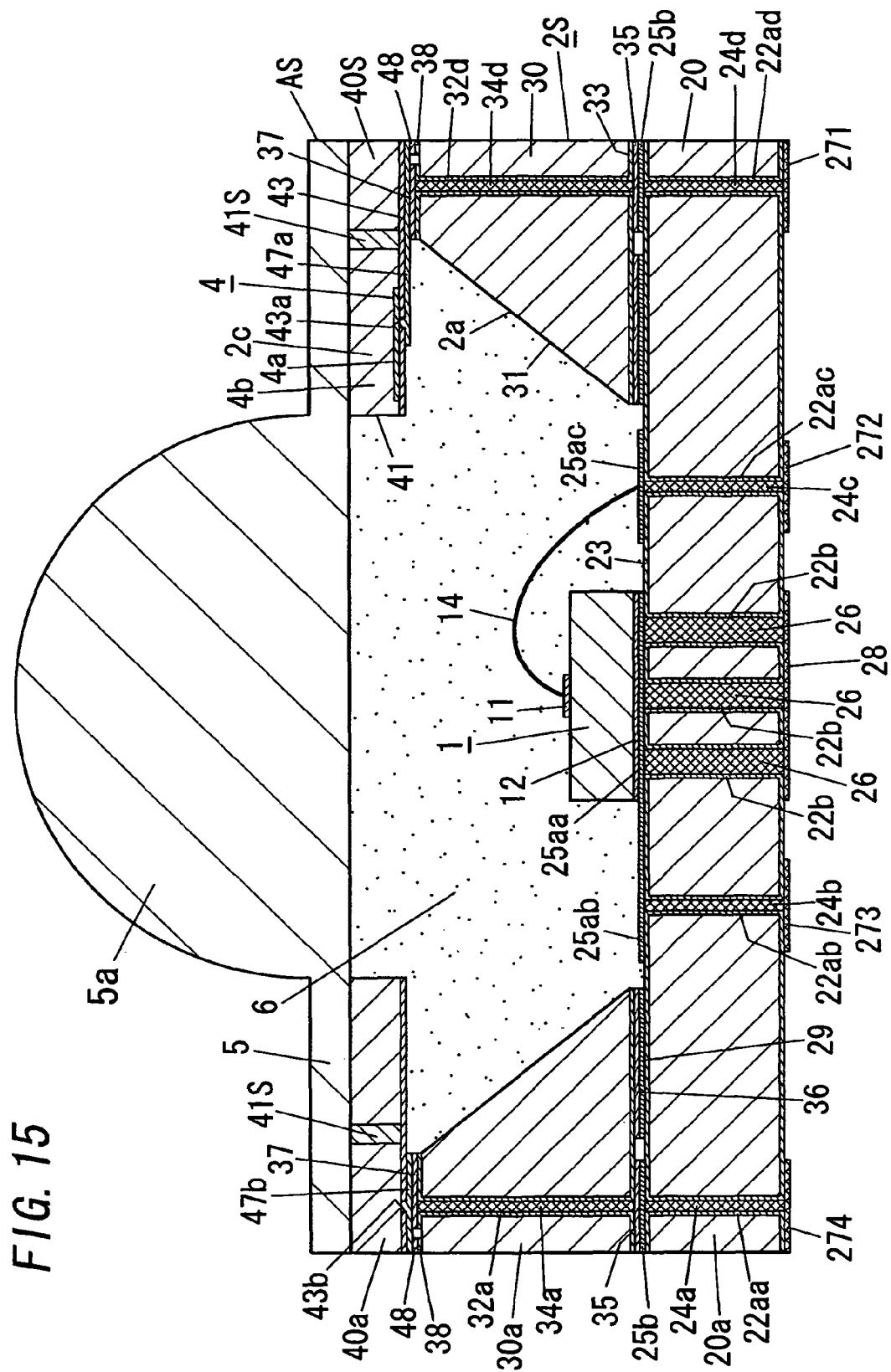
FIG. 15 shows a side cross sectional view of the surface mounting type LED package in the sixth embodiment.

FIG. 15 shows a side cross sectional view of the surface mounting type LED package A in this embodiment. As will be understood from FIG. 15, the surface mounting type LED package A in this modification comprises a frame 40S which has a heat insulation layer 41S. The frame 40S is disposed on the upper surface of the spacer 30. The frame 40 is made from the silicon substrate 40a. The silicon substrate is provided at its front surface and also its rear surface with an electrical insulation film 43. The silicon substrate 40a is provided at its center with an aperture 41. The aperture 41 penetrates through the silicon substrate 40a in the thickness direction of the silicon substrate 40a. The silicon substrate 40a is provided at its lower surface with a light detection element 4 and a wiring 37. The aperture 41 is formed such that the aperture 41 is in communication with the opening 31. The aperture 41 has a dimension which is smaller than the dimension of the opening 31. Consequently, the frame 40 is provided with a projection portion 2c which is projected inwardly of the upper end of the inside circumference surface of the spacer 30. The silicon substrate 40a is formed at its lower surface of the projection portion 2c with a light detection element 4. The silicon substrate 40a is provided at its lower surface with a wiring 47a. The wiring 47a electrically connects the light detection element 4 to the penetration wiring 34d. In addition, the silicon substrate 40a further comprises a heat insulation layer 41S. The heat insulation layer 41S is formed in the silicon substrate 40a such that the heat insulation layer 41S penetrates through the silicon substrate 40a in the thickness direction. In addition, the heat insulation layer 41S is formed in the silicon substrate 40a such that the heat insulation layer 41S surrounds the light detection element 4. In addition, as will be understood from FIG. 15, the heat insulation layer 41S is located between "the light detection element 4" and "the upper end of the inside circumference surface of the spacer 30". Therefore, the heat insulation layer 41S is configured to prevent the translation of the heat generated in the LED chip 1 to the light detection element.

In this manner, it is possible to mount the surface mounting type LED package on the upper surface of the flexible wiring substrate 100.

Figure 16:
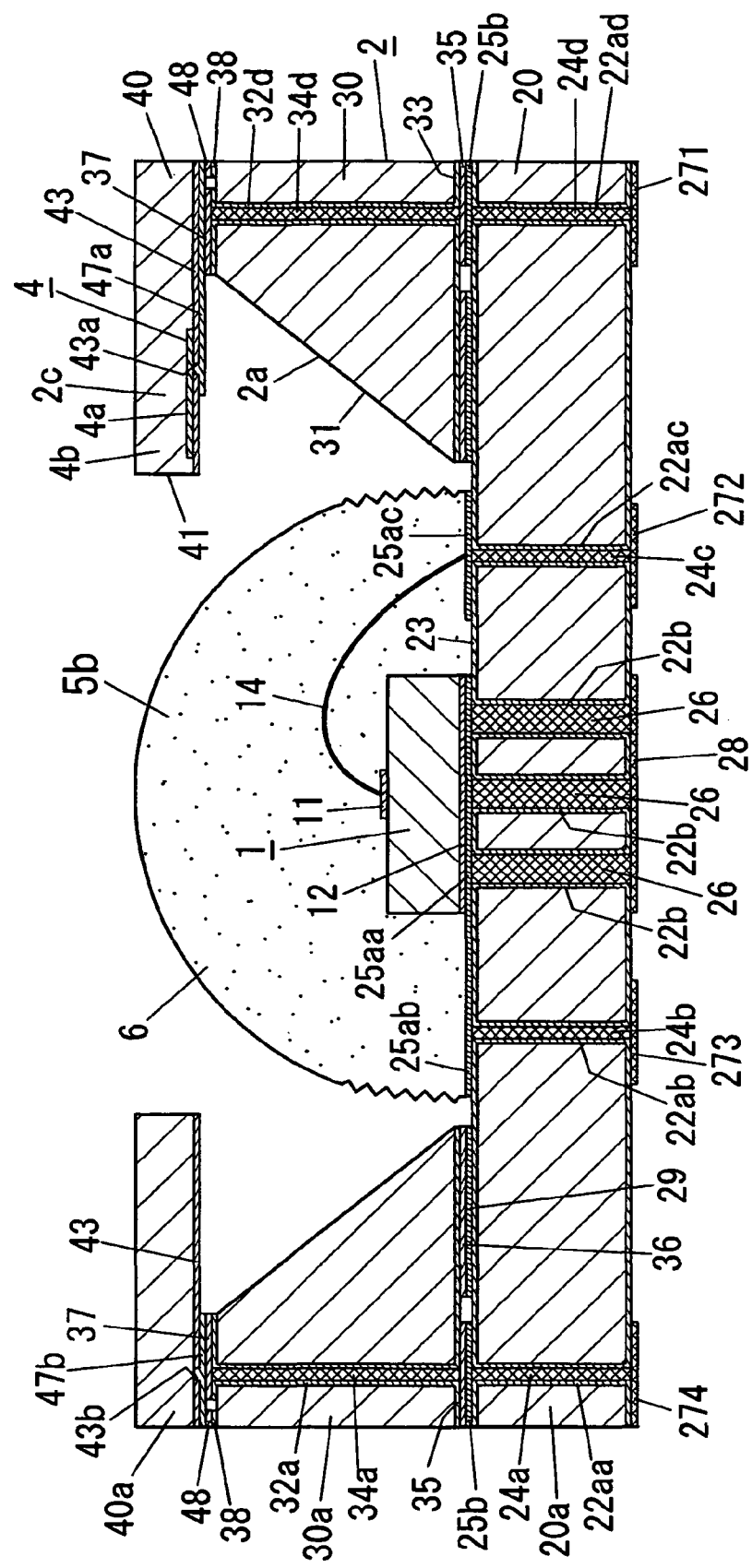
FIG. 16 shows a surface mounting type LED package of another embodiment.
Figure 17:
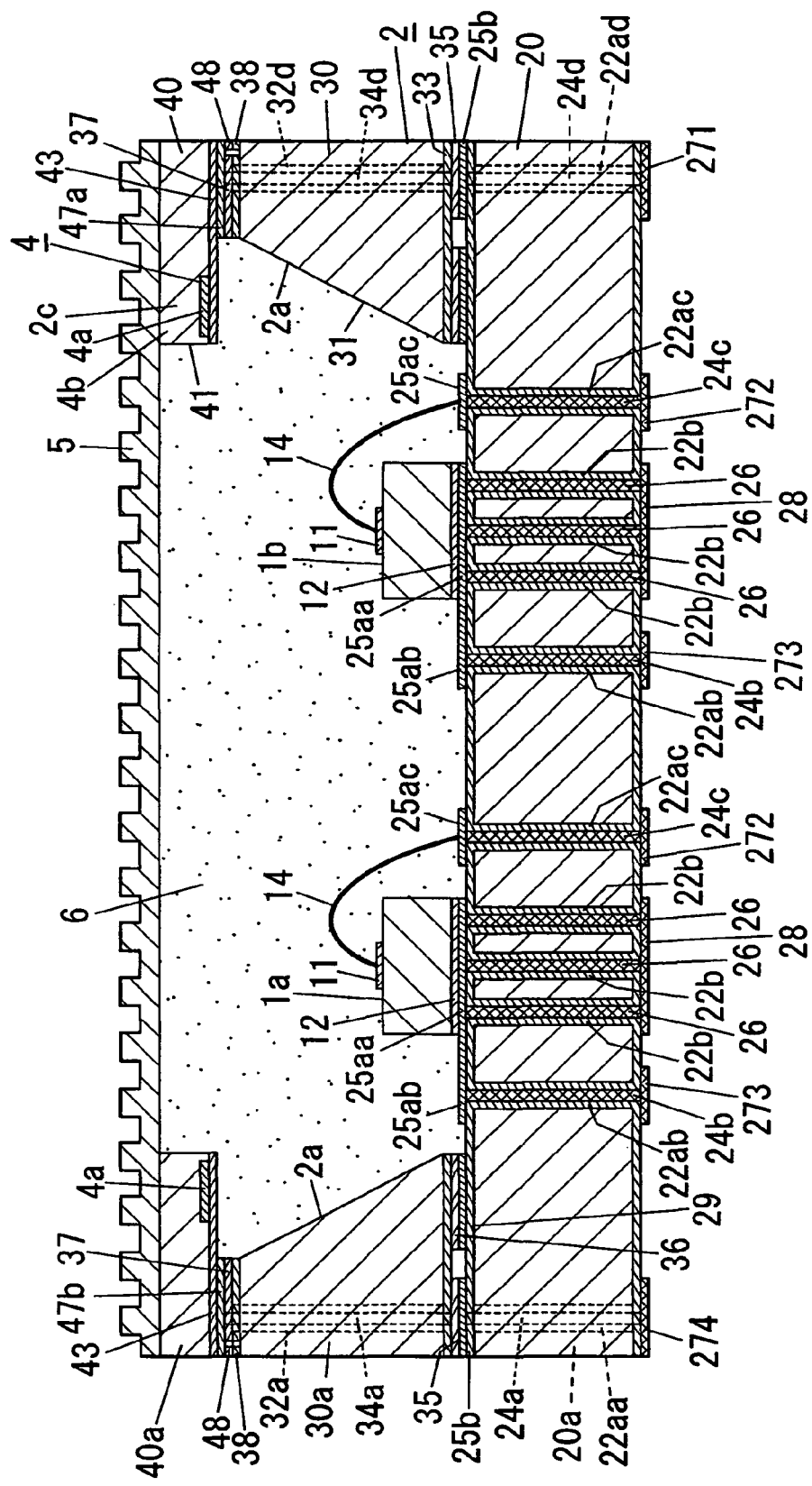
FIG. 17 shows a surface mounting type LED package of another embodiment.
Figure 18:
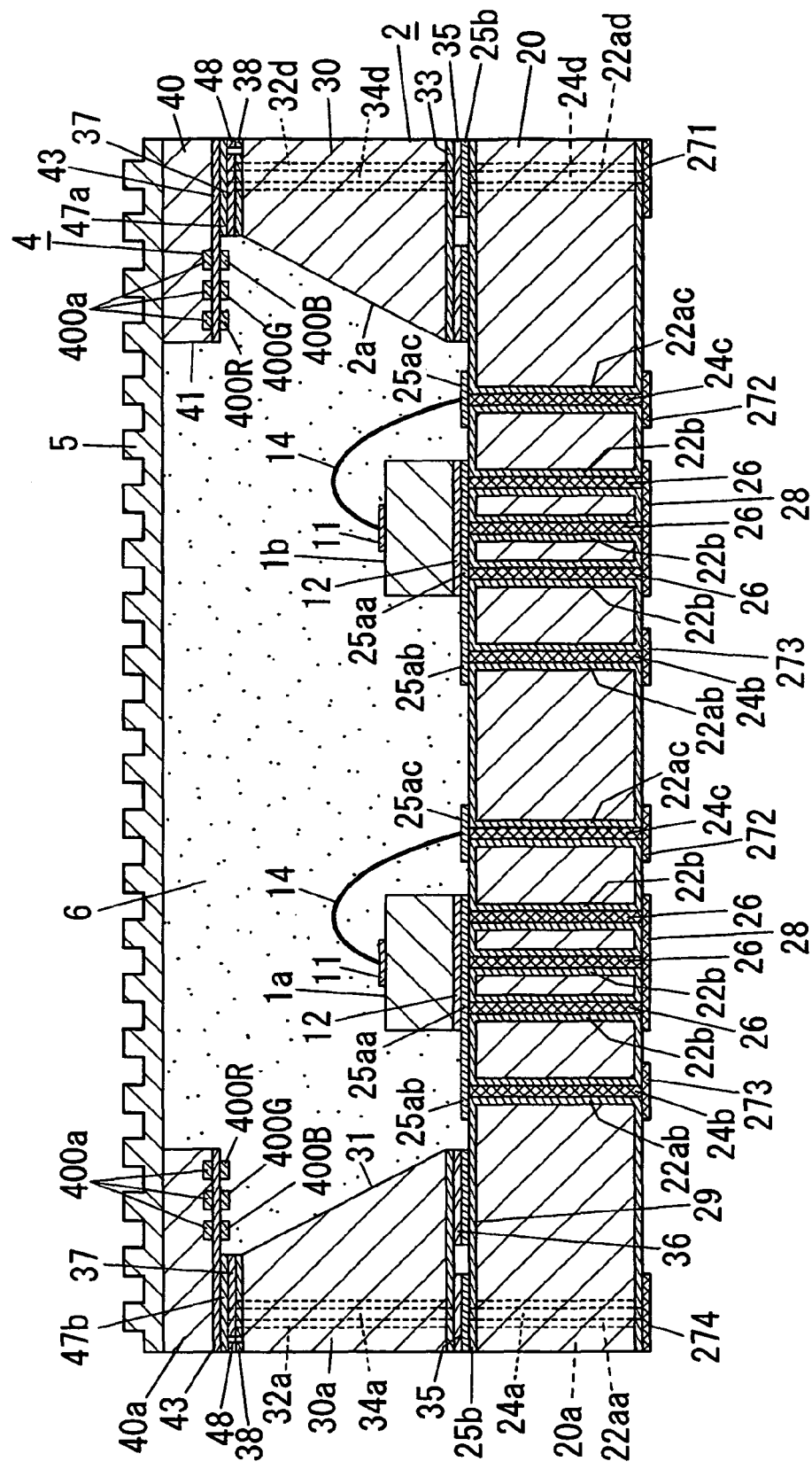
FIG. 18 shows a surface mounting type LED package of another embodiment.

Each one of FIG. 16, FIG. 17, and FIG. 18 shows a modification of the surface mounting type LED package A which is mounted on the flexible wiring substrate 100.

The surface mounting type LED package in FIG. 16 comprises a sealing material 5b shaped to have a lens shape, instead of the sealing material 6 and the cover 5. The sealing material 5b is attached to the front surface of the base 20 through the lower end of the sealing material 5B. With this configuration, the sealing material 5b is cooperative with the base 20 to incorporate the LED chip 1 between the base 20 and the sealing material 5b. The sealing material 5b has a front end which is located backwardly of the front surface of the frame 40. With this configuration, it is possible to obtain a thin surface mounting type LED package.

The surface mounting type LED package in FIG. 17 comprises a plurality of the LED chips. Specifically, the surface mounting type LED package in FIG. 17 comprises a blue LED chip, a red LED chip, and a green LED chip. The blue LED chip is configured to emit the light having blue color.

The red LED chip is configured to emit the light having red color. The green LED chip is configured to emit the light having green color. Further to the above configuration, the surface mounting type LED package in FIG. 18 shows a blue color sensor 400B, a red color sensor 400R, and a green color sensor 400G. The blue color sensor 400B is configured to detect the light having a blue color. The red color sensor 400R is configured to detect the light having a red color. The green color sensor 400G is configured to detect the light having a green color. Each one of the color sensors 400*a* is disposed in the projection portion of the frame. Consequently, the color sensors 400*a* surround the LED chips. With this configuration, each one of the color sensors 400*a* (400B, 400R, 400G) is configured to detect the color of the light which is emitted from each one of the LED chips. In this manner, the LED module B in this embodiment is possible to mount the surface mounting type LED packages.

Although the present invention is described with particular reference to the above illustrated embodiments, the present invention should not be limited thereto, and should be interpreted to encompass any combinations of the individual features of the embodiments.

The invention claimed is:

1. An LED module comprising:
   a flexible wiring substrate being provided at its surface with a plurality of power supply terminals,
   said flexible wiring substrate being provided with a patterned wiring,
   each of said power supply terminals comprising a first electrode pad and a second electrode pad,
   each of said power supply terminals being electrically connected to said patterned wiring,
   a plurality of surface mounting type LED packages which are mounted on said flexible wiring substrate,
   each of said surface mounting type LED chip comprising an LED chip and a mounting substrate,
   each of said mounting substrate being formed at its front surface with a recess, and being formed at its rear surface with an external connection electrode, said external connection electrode comprising a first connection electrode and a second connection electrode,
   each of said mounting substrate being mounted on said flexible wiring substrate such that said first connection electrode and said second connection electrode are electrically connected to said first electrode pad and said second electrode pad, respectively,
   said LED chip being disposed within said recess,
   said LED chip being configured to receive electrical current through said external connection electrode and said power supply terminal,
   and
   said LED module being formed by cutting an LED module wafer,
   said LED module wafer comprising an LED package wafer and a flexible wiring wafer,
   said LED package wafer comprising a plurality of said surface mounting type LED packages,
   said flexible wiring wafer being formed into said flexible wiring substrate when said flexible wiring wafer is cut,
   said flexible wiring wafer being directly coupled to said LED package wafer such that each of said patterned wiring being connected to each of said external connection electrode,
   said LED package wafer being formed with a groove which reaches a top surface of said flexible wiring substrate, and
   said groove surrounding each of said surface mounting type LED package so that said surface mounting type LED package is spaced from adjacent said surface mounting type LED package.

2. The LED module as set forth in claim 1, wherein
   said flexible wiring substrate is provided with an electrical insulation substrate, a first penetration wiring and a second penetration wiring, said electrical insulation substrate has flexibility,
   said patterned wiring being disposed in an internal portion of said electrical insulation substrate,
   said first penetration wiring being formed in said internal portion of said electrical insulation substrate so as to electrically connect said first connection electrode to said patterned wiring,
   said second penetration wiring being formed in said internal portion of said electrical insulation substrate so as to electrically connect said second connection electrode with said patterned wiring.

3. The LED module as set forth in claim 2, wherein
   said patterned wiring comprises a first patterned circuit and a second patterned circuit,
   said first patterned circuit being spaced from said second patterned circuit,
   said first penetration wiring being spaced from said second patterned circuit,
   said first penetration wiring being formed in said electrical insulation substrate so as to electrically connect said first connection electrode to said first patterned circuit,
   said second penetration wiring being spaced from said first patterned circuit,
   said second penetration wiring being formed in said electrically insulation substrate so as to electrically connect said second connection electrode to said second patterned circuit,
   said first penetration wiring being spaced from said second penetration wiring.

4. The LED module as set forth in claim 1, wherein
   said surface mounting type LED package further comprising a thermal via and a heat radiation layer,
   said heat radiation layer being disposed on said rear surface of said mounting substrate,
   said heat radiation layer has heat conductivity which is higher than heat conductivity of said mounting substrate,
   said thermal via being configured to thermally couple said LED chip to said heat radiation layer,
   said thermal via having heat conductivity which is higher than the heat conductivity of said mounting substrate,
   said flexible wiring substrate further comprising a first heat radiation pad and a second heat radiation pad,
   said first heat radiation pad is formed on said front surface of said flexible wiring substrate,
   said second heat radiation pad is formed on said rear surface of said flexible wiring substrate,
   said surface mounting type LED package being mounted on said flexible wiring substrate such that said first heat radiation pad is in contact with said heat radiation layer,
   said first heat radiation pad is aligned with said second heat radiation pad in a thickness direction of said flexible wiring substrate.

5. The lighting device using the LED module as set forth in claim 1.

6. The LED module as set forth in claim 2, wherein
   said first patterned circuit and said second patterned circuit are formed in said electrical insulation substrate such that said first patterned circuit is spaced from said second patterned circuit in a thickness direction of said flexible wiring substrate.

7. The LED module as set forth in claim 6, wherein
said flexible wiring substrate is provided at its rear surface with a plurality of external terminal, each of said external terminal comprising a first terminal electrode and a second terminal electrode,
each of said first penetration wiring being configured to electrically connect said first terminal electrode to said first connection electrode,
each of said second penetration wiring being configured to electrically connect said second terminal electrode to said second connection electrode.

8. The LED module as set forth in claim 7, wherein
said first patterned circuit comprising a first lengthwise wiring and a plurality of first widthwise wiring which are transverse to said first lengthwise wiring,
said second patterned circuit comprising a second lengthwise wiring and a plurality of second widthwise wiring which are transverse to said second lengthwise wiring.

9. The LED module as set forth in claim 8, wherein
said first patterned circuit is provided with a first intersection point at which said first lengthwise wiring intersects the first widthwise wiring,
said second patterned circuit being provided with a second intersection point at which said second lengthwise wiring intersects the second lengthwise wiring,
said first intersection point is displaced from said second intersection point.

10. The LED module as set forth in claim 1, wherein
said mounting substrate comprising a first base and a second base,
said first base being made from a semiconductor substrate,
said first base being formed with an opening which penetrates through said first base along a thickness direction of said first base so that said first base being shaped to have a frame shape,
said second base being shaped to have a mount portion which is protruded forwardly,
said mounting portion having a shape which corresponds to a shape of said opening of said first base,
said first base being disposed on said second base such that said mount portion being inserted into said mount opening,
said LED chip being mounted on said mount section,
said second base being made of metal, and is provided at its surface with an electrical insulation film.

11. The LED module as set forth in claim 1, wherein
said mounting substrate comprising a base, a spacer, and a frame,
both said spacer and said frame being made from a semiconductor substrate,
said spacer being shaped to have an opening which penetrates through said spacer in a thickness direction of said spacer, said spacer being disposed on a front surface of said base,
said frame being formed with an aperture,
said frame being disposed on a front surface of said spacer such that said frame being spaced from said base,
said base being cooperative with said spacer and said frame to form said recess,
said base has heat conductivity which is higher than heat conductivity of said semiconductor substrate.

12. The LED module as set forth in claim 11, wherein
said base being made of metal,
said base being provided at its surface with an electrical insulation film,
said external connection electrode and said power supply terminal being electrically insulated from said base by said electrical insulation film.

13. The LED module as set forth in claim 1, wherein
said mounting substrate comprising a base and a heat radiation plate,
said heat radiation plate being disposed in said base such that said heat radiation plate penetrates through said base in a thickness direction of said base,
said LED chip being located in an upper side of said heat radiation plate,
said heat radiation plate being made of metal,
said heat radiation plate is provided at its surface with an electrical insulation film,
said base being made of a light-sensitive resin composition.

14. The LED module as set forth in claim 13, wherein
said mounting substrate further comprising a spacer and a frame,
said spacer being formed with an opening which penetrates through said spacer in a thickness direction of said spacer,
said spacer being disposed on a front surface of said base,
said frame being made of semiconductor,
said frame being formed with an aperture,
said frame being disposed on a front surface of said spacer such that said frame being spaced from said base,
said base being cooperative with said spacer and said frame to form said recess,
said spacer being made of a light-sensitive resin composition.

15. The LED module as set forth in claim 1, wherein
each of said surface mounting type LED package further comprising a light detection element,
said light detection element being configured to detect an amount of light which is emitted from said LED lamp.

16. Method for manufacturing the LED module as set forth in claim 1, comprising steps of:
forming a plurality of said surface mounting type LED package on said LED package wafer;
preparing said flexible wiring wafer which is cut into said flexible wiring substrate;
forming said LED module wafer including said LED package wafer and said flexible wiring wafer by coupling said flexible wiring wafer with said LED package wafer directly such that each said patterned wiring is connected to each said external connection electrode;
forming, on said LED package wafer, said groove which reaches the top surface of said flexible wiring substrate and is configured that each one of surface mounting type LED package is spaced from each the other of said surface mounting type LED package by said groove; and
cutting said LED package wafer into a predetermined shape including a plurality of said surface mounting type LED package.

17. The LED module as set forth in claim 15, wherein
said surface mounting type LED package further comprising an electrical current regulation circuit,
said electrical current regulation circuit being configured to regulate the electrical current which is applied to said LED chip on the basis of an amount of said light by which said light detection element detects.

18. The LED module as set forth in claim 17, wherein
said LED module being formed by cutting an LED module wafer,
said LED module wafer comprising an LED package wafer and a flexible wiring wafer, said LED package wafer comprising a plurality of said surface mounting type LED package, a plurality of said light detection element, and a plurality of said electrical current regulation circuit, said flexible wiring wafer being formed into said flexible wiring substrate when said flexible wiring wafer is cut, said flexible wiring wafer being directly coupled to said LED package wafer such that each said patterned wiring is electrically connected to each said external connection electrode, said LED package wafer being formed with a groove which reaches a top surface of said flexible wiring substrate, said groove being configured to surround said surface mounting type LED package so that said surface mounting type LED package is spaced from adjacent said surface mounting type LED package.

19. The LED module as set forth in claim 17, wherein
said surface mounting type LED package further comprising a temperature detection element,
said temperature detection element being configured to detect temperature of said LED chip,
said electrical current regulation circuit being configured to regulate an amount of the electrical current on the basis of an amount of the light by which the light detection element detects, and also on the basis of the temperature of sais LED chip.

20. The LED module as set forth in claim 19, wherein
said light detection element comprising a photo diode,
said temperature detection element has a diode structure which is in common with a diode structure of the photo diode,
said surface mounting type LED package further comprising a light shielding structure,
said light shielding structure being configured to prevent an irradiation of the light which is emitted by said LED chip to the temperature detection element.

21. The LED module as set forth in claim 19, wherein
said temperature detection element being disposed on said mounting substrate such that said temperature detection element is located backwardly of said LED chip.

22. The LED module as set forth in claim 21, wherein
said surface mounting type LED package further comprising a plurality of thermal vias and a heat radiation layer,
said heat radiation layer being disposed on said rear surface of said mounting substrate,
heat radiation layer having heat conductivity which is higher than heat conductivity of said mounting substrate,
each said thermal via being configured to thermally couple said LED chip to said heat radiation layer,
each said thermal via having heat conductivity which is higher than the heat conductivity of said mounting substrate,
said thermal vias being electrically insulated from each other,
said flexible wiring substrate further comprising a first heat radiation pad and a second heat radiation pad,
said first heat radiation pad being disposed on a front surface of said flexible wiring substrate,
said second heat radiation pad being disposed on a rear surface of said flexible wiring substrate,
said surface mounting type LED package being mounted on said flexible wiring substrate such that said first heat radiation pad is in contact with said heat radiation layer,
said first heat radiation pad being aligned with said second heat radiation pad in a thickness direction of said flexible wiring substrate,
said temperature detection element comprising a diode which has a p-type region and an n-type region,
both said p-type region and said n-type region are thermally coupled to each said thermal via.

23. The LED module as set forth in claim 15, wherein
said mounting substrate comprising a base, a spacer, and a frame,
said spacer being formed with an opening,
said opening penetrating through said spacer in a thickness direction of said spacer,
said spacer being disposed on a front surface of said base,
said frame being formed with an aperture, and being disposed on a front surface of said spacer such that said frame being spaced from said base,
said base being cooperative with said spacer and said frame to form said recess,
said frame is formed to have an inner circumference surface which is located inwardly of an upper end of an inner circumference surface of said spacer,
said light detection element being disposed on a lower surface of said frame such that said light detection element being located between said inner circumference surface of said frame and said inner circumference surface of said spacer.

24. The LED module as set forth in claim 23, wherein
said base being cooperative with said spacer and said frame to construct a heat transfer path,
said heat transfer path transferring heat which is generated by said LED chip to said light detection element,
said surface mounting type LED package further comprising a heat insulation layer,
said heat insulation layer being disposed in said base or said frame such that said heat insulation layer being located in said heat transfer path,
said heat insulation layer having heat conductivity which is lower than heat conductivity of said semiconductor.

25. The LED module as set forth in claim 24, wherein
said heat insulation layer being disposed in said base such that said heat insulation layer is located between said LED chip and a lower end of an inside circumference surface of said spacer,
said heat insulation layer being disposed in said base such that said heat insulation layer surrounds an entire circumference of said LED chip.

26. The LED module as set forth in claim 24, wherein
said heat insulation layer being disposed in said frame such that said heat insulation layer is located between said light detection element and an upper end of an inside circumference surface of said spacer,
said heat insulation layer being disposed in said frame such that said heat insulation layer surrounds an entire circumference of said light detection element.

27. The lighting device comprising the LED module in claim 15, wherein
said lighting device further comprising a controller,
said controller being configured to regulate an amount of the electrical current which is supplied to each said surface mounting type LED package on the basis of an amount of the light which is detected by the light detection element, whereby a plurality of said surface mounting type LED packages emit a predetermined amount of the light.

28. The lighting device as set forth in claim 27, wherein
said surface mounting type LED package further comprising a temperature detection element,
said temperature detection element being configured to detect a temperature of the LED chip, said controller being configured to regulate the electrical current supplied to a plurality of said surface mounting type LED package on the basis of an amount of the light by which said light detection element detects, and on the basis of the temperature by which said temperature detection element detects, whereby a plurality of said surface mounting type LED package emits a predetermined amount of the light.

* * * * *